(12) United States Patent
Kanai et al.

(10) Patent No.: US 10,127,957 B2
(45) Date of Patent: Nov. 13, 2018

(54) CONTROL METHOD FOR MAGNETORESISTANCE EFFECT ELEMENT AND CONTROL DEVICE FOR MAGNETORESISTANCE EFFECT ELEMENT

(71) Applicant: TOHOKU UNIVERSITY, Sendai-shi, Miyagi (JP)

(72) Inventors: Shun Kanai, Sendai (JP); Fumihiro Matsukura, Sendai (JP); Hideo Ohno, Sendai (JP); Michihiko Yamanouchi, Sendai (JP); Shoji Ikeda, Sendai (JP); Hideo Sato, Sendai (JP)

(73) Assignee: TOHOKU UNIVERSITY, Sendai-Shi, Miyagi (JP)

( * ) Notice: Subject to any disclaimer, the term of this patent is extended or adjusted under 35 U.S.C. 154(b) by 0 days.

(21) Appl. No.: 15/108,396

(22) PCT Filed: Nov. 13, 2014

(86) PCT No.: PCT/JP2014/080008
§ 371 (c)(1),
(2) Date: Jul. 25, 2016

(87) PCT Pub. No.: WO2015/098335
PCT Pub. Date: Jul. 2, 2015

(65) Prior Publication Data
US 2016/0329086 A1    Nov. 10, 2016

(30) Foreign Application Priority Data
Dec. 27, 2013   (JP) .................................. 2013-272703

(51) Int. Cl.
*G11C 11/00* (2006.01)
*G11C 11/16* (2006.01)

(52) U.S. Cl.
CPC ........ *G11C 11/161* (2013.01); *G11C 11/1675* (2013.01); *G11C 11/1693* (2013.01)

(58) Field of Classification Search
CPC ....................................................... G11C 11/02
(Continued)

(56) References Cited

U.S. PATENT DOCUMENTS

| 6,773,833 B2 * | 8/2004 | Inomata ................. B82Y 25/00 360/99.15 |
| 2011/0026322 A1 | 2/2011 | Ohmori et al. |

(Continued)

FOREIGN PATENT DOCUMENTS

| JP | 2007-123455 A | 5/2007 |
| JP | 2007-300079 A | 11/2007 |

(Continued)

OTHER PUBLICATIONS

Dec. 22, 2014 International Search Report issued in International Patent Application No. PCT/JP2014/080008.
(Continued)

*Primary Examiner* — Hoai V Ho
(74) *Attorney, Agent, or Firm* — Rabin & Berdo, P.C.

(57) ABSTRACT

A control method for a magnetoresistance effect element and a control device for the magnetoresistance effect element that provide a higher writing speed and lower power consumption. When the magnetization direction of a second magnetic layer is nearly parallel to the magnetization direction of a first magnetic layer, a first voltage is applied across the first and second magnetic layer so that the magnetization direction of the second magnetic layer is reversed by modifying the direction of the magnetization easy axis thereof, followed by the application of a second voltage. When the magnetization direction of the second magnetic layer is nearly antiparallel to the magnetization direction of the first
(Continued)

magnetic layer, a third voltage is applied across the first magnetic layer and the second magnetic layer, followed by the application of a fourth voltage so that current flows from the second magnetic layer toward the first magnetic layer.

20 Claims, 12 Drawing Sheets

(58) Field of Classification Search
USPC .......................................................... 365/158
See application file for complete search history.

(56) References Cited

U.S. PATENT DOCUMENTS

| | | | | |
|---|---|---|---|---|
| 2014/0085969 | A1* | 3/2014 | Saida | G11C 11/1675 365/158 |
| 2014/0301136 | A1* | 10/2014 | Inokuchi | G11C 11/161 365/158 |
| 2015/0236071 | A1* | 8/2015 | Lee | H01L 27/222 257/421 |
| 2016/0276006 | A1* | 9/2016 | Ralph | G11C 11/18 |

FOREIGN PATENT DOCUMENTS

JP  2010-079986 A  4/2010
WO  2009/128485 A1  10/2009

OTHER PUBLICATIONS

D. Bedau et al; "Spin-transfer pulse switching: From the dynamic to the thermally activated regime," Applied Physics Letters; 2010; 97; pp. 262502-1-262502-3.

M. Hosomi et al; "A Novel Nonvolatile Memory with Spin Torque Transfer Magnetization Switching: Spin-RAM;" IEDM; 2005; pp. 459-462.

Y. Shiota et al; "Induction of coherent magnetization switching in a few atomic layers of FeCo using voltage pulses," Nature Materials; Nov. 2011; vol. 11; No. 39; pp. 1-5.

S. Kanai et al; "Electric field-induced magnetization reversal in a perpendicular-anisotropy CoFeB-MgO magnetic tunnel junction;" Applied Physics Letters; 2012; 101; pp. 122403-1-122403-3.

Jun. 28, 2016 International Preliminary Report on Patentability issued in International Patent Application No. PCT/JP2014/080008.

* cited by examiner

CONTROL METHOD FOR MAGNETORESISTANCE EFFECT ELEMENT AND CONTROL DEVICE FOR MAGNETORESISTANCE EFFECT ELEMENT

TECHNICAL FIELD

The present invention relates to a control method for a magnetoresistance effect element and a control device for a magnetoresistance effect element.

BACKGROUND ART

Magnetoresistance effect elements having a three-layer structure of ferromagnetic layer/non-magnetic layer/ferromagnetic layer undergo a change in resistance depending upon the relative direction of magnetization in two ferromagnetic layers, and, thus, can be used as magnetic memory cells that record information as a magnetization direction by associating two states, that is, particularly a state where the magnetization direction of one of the ferromagnetic layers is nearly parallel to that in the other ferromagnetic layer and a state where the magnetization direction of one of the ferromagnetic layers is nearly antiparallel to that in the other ferromagnetic layer, with "0" or "1", respectively. Information is read by reading element resistance. The non-magnetic layer may be either a metal or an insulator. Conventionally, there has been a plurality of rewriting methods (magnetization reversal methods) in magnetoresistance effect elements. Among them, electric writing methods in which a voltage is applied across the ferromagnetic layers are advantageous from the viewpoints of higher integration and lower power consumption. Representative writing methods include spin injection magnetization reversal methods and electric field induced magnetization reversal methods.

As illustrated in FIG. 11, in the spin injection magnetization reversal method, current is applied across a three-layer structure of ferromagnetic layer/non-magnetic layer/ferromagnetic layer to perform magnetization reversal through giving and receiving of angular momentum. The direction of magnetization reversal can be regulated by the direction of current. In one example illustrated in FIG. 11, the lower electrode and the upper electrode are provided as a stationary layer that is less likely to undergo magnetization reversal than the upper electrode and a recording layer, respectively, and, when positive voltage is applied to a terminal B on the recording layer side relative to a terminal A on the stationary layer side, current flows from the recording layer side to the stationary layer side and, as a result, magnetization reversal occurs so that the magnetization direction in the recording layer is parallel to the magnetization direction of the stationary layer. When a negative voltage is applied to the terminal B relative to the terminal A, magnetization reversal occurs so that the magnetization direction of the recording layer is antiparallel to that in the stationary layer.

Thus, in the spin injection magnetization reversal method, the direction of the magnetization reversal is determined by the direction of the current, and the flow of a larger current for a longer period of time contributes to an improvement in the probability of success in information writing. For this reason, in the information writing, the stability of information writing can be ensured by applying current for a longer period of time than a magnetization reversal time expected as a necessary minimum time. The magnetization reversal time in the spin injection magnetization reversal method can be reduced by increasing the amount of current. However, it is known that, in a region where the magnetization reversal time is about 1 ns (nanosecond), the current necessary for writing is sharply increased (see, for example, Non-Patent Literature 1 or 2). Since the current applicable to the element has an upper limit, the actual writing time is approximately several ns to several tens of ns. The power consumption necessary for rewriting one memory cell once is determined by an energy loss derived from Joule heat and is about 1 pj for high-performance magnetoresistance memory cells.

In order to reduce the power consumption in the spin injection magnetization reversal method, a method has been proposed in which, after the application of a first current lower than a threshold current that is a current necessary for magnetization reversal with a single current pulse, a second current that is higher than the first current and is smaller than the threshold current value is applied (for example, see Patent Literature 1).

As illustrated in FIG. 12, the electric field induced magnetization reversal method uses a capacitor structure element having a three-layer structure of ferromagnetic layer/insulating layer/metallic layer. In one example illustrated in FIG. 12, the application of a voltage across the terminal A on the metallic layer side and the terminal B on the ferromagnetic layer side causes a change in magnetic anisotropy of the ferromagnetic layer to produce a magnetic field in a direction indicated by an arrow. In the following explanation, the direction of magnetization easy axis of the ferromagnetic layer is a perpendicular direction, and a direction parallel to the film surface is easy to magnetize by the application of a voltage. Alternatively, an arrangement may also be possible in which a magnetic field in a direction perpendicular to the film surface is produced by applying a voltage to magnetization having an in-plane magnetization easy axis (see, for example, Non-Patent Literature 3). In the magnetization of the ferromagnetic layer, the magnetization reversal can be carried out by performing precession with a produced magnetic field as an axis and cutting off the voltage when approximately half-cycle precession has been performed, to again bring the magnetization to perpendicular easy magnetization (see, for example, Non-Patent Literature 4).

The magnetization reversal time in the electric field induced magnetization reversal method is on the order of several hundreds of ps (picoseconds) to 1 ns. The polarity of the applied voltage is identical in both magnetization reversal from a parallel state to an antiparallel state and magnetization reversal from an antiparallel state to a parallel state. In writing, the voltage amplitude and the applied time (voltage pulse length) need to be regulated, and the time error acceptable when the applied voltage amplitude is fixed is on the order of several tens of picoseconds. When the element resistance through the insulating layer is sufficiently large and the energy loss by Joule heat is small, the electric power consumed in writing into one memory cell once is an electric power necessary for storing electric charges between the ferromagnetic layer and the metallic layer and is about 1 fj.

CITATION LIST

Non-Patent Literature

Non-Patent Literature 1: D. Bedau et al., "Spin-transfer pulse switching: From the dynamic to the thermally activated regime", Appl. Phys. Lett., 2010, 97, 262502

Non-Patent Literature 2: M. Hosomi et al., "A novel non-volatile memory with spin torque transfer magnetization switching: spin-ram", IEDM, 2005, pp. 459-462

Non-Patent Literature 3: Y. Shiota, T. Nozaki, F. Bonell, S. Murakami, T. Shinjo, and Y. Suzuki, "Induction of coherent magnetization switching in a few atomic layers of FeCo using voltage pulses", Nature Mater. 2012, 11, 39

Non-Patent Literature 4: S. Kanai, M. Yamanouchi, S. Ikeda, Y. Nakatani, F. Matsukura, and H. Ohno, "Electric field-induced magnetization reversal in a perpendicular-anisotropy CoFeB—MgO magnetic tunnel junction", Appl. Phys. Lett., 2012, 101, 122403

Patent Literature

Patent Literature 1: Japanese Unexamined Patent Application, Publication No. 2007-300079

SUMMARY OF INVENTION

Technical Problem

The writing by the conventional spin injection magnetization reversal method in which reliability of the writing can be enhanced by increasing the writing time, but on the other hand, has a problem that, as compared with the electric field induced magnetization reversal method, the writing speed is slower and the power consumption is larger. The power consumption can be reduced by the method described in Patent Literature 1. The level of the reduction in power consumption, however, is approximately a fraction of the power consumption, and, also in this case, as compared with the electric field induced magnetization reversal method, the writing speed is yet slower, and the power consumption is larger. The power consumption can be reduced by the method described in Patent Literature 1. However, the power consumption is reduced by approximately one severalth, and, here again, as compared with the electric field induced magnetization reversal method, the writing speed is slower and the power consumption is larger. In the spin injection magnetization reversal method, a time of approximately a fraction of nanosecond to several nanoseconds (a dead time) is necessary as a period of time from the application of voltage to the start of the magnetization reversal. This is also a factor of making it impossible to increase the writing speed.

In writing by the electric field induced magnetization reversal method, as compared with the spin injection magnetization reversal method, it is expected that a writing speed is increased by several times to several tens of times and power consumption is decreased by approximately several hundreds of times to one thousand times. In order to carry out stable magnetization reversal while ensuring reliable writing, the voltage application time should be regulated with an accuracy of several tens of picoseconds, and the regulation with this accuracy has been disadvantageously very difficult.

The present invention has been made while focusing attention on the above problem, and an object of the present invention is to provide a control method for a magnetoresistance effect element and a control device for a magnetoresistance effect element that provide a higher writing speed and a lower power consumption than a spin injection magnetization reversal method, and, at the same time, can realize a highly controllable and stable magnetization reversal operation.

Solution to Problem

The present inventors have found that a magnetization reversal method that provides a higher writing speed and a lower power consumption than the spin injection magnetization reversal method, and, at the same time, can realize a higher controllability than the electric field induced magnetization reversal method can be obtained by taking an advantage of features of both the spin injection magnetization reversal method and the electric field induced magnetization reversal method, which has led to the completion of the present invention.

Specifically, a control method for a magnetoresistance effect element according to a first invention is a control method in which the magnetoresistance effect element comprises: a first magnetic layer; and a second magnetic layer with the magnetization direction easier to be modified than that of the first magnetic layer, wherein the magnetization direction of the second magnetic layer is reversed by performing an electric field induced magnetization reversal method before performing a spin injection magnetization reversal method.

A control device for a magnetoresistance effect element according to the first invention comprises: the magnetoresistance effect element comprising a first magnetic layer and a second magnetic layer with the magnetization direction easier to be modified than that of the first magnetic layer; and a control unit provided so that the magnetization direction of the second magnetic layer is reversed by performing an electric field induced magnetization reversal method before performing a spin injection magnetization reversal method.

In the control method for a magnetoresistance effect element and the control device for a magnetoresistance effect element according to the first invention, when the magnetization direction of the second magnetic layer is substantially reversed by using the electric field induced magnetization reversal method before the utilization of the spin injection magnetization reversal method, as compared with the case of the utilization of only the spin injection magnetization reversal method, the writing speed is higher and the power consumption is lower. Further, since the probability of success in magnetization reversal can be enhanced by the spin injection magnetization reversal method after reversing the magnetization direction of the second magnetic layer by the electric field induced magnetization reversal method, there is no need to regulate the voltage application time with a high accuracy in utilizing the electric field induced magnetization reversal method. Accordingly, the electric field induced magnetization reversal method can easily be regulated, and, on the whole, a stable and highly controllable magnetization reversal operation can be performed.

In the control method for a magnetoresistance effect element and a control device for a magnetoresistance effect element according to the first invention, when the electric field induced magnetization reversal method is utilized before the utilization of the spin injection magnetization reversal method, the magnetization reversal can be immediately started. Accordingly, there is no dead time which occurs in the spin injection magnetization reversal method, so that it possible to increase the writing speed.

A control method for a magnetoresistance effect element according to a second invention is a control method in which the magnetoresistance effect element comprises: a first magnetic layer; a second magnetic layer with the magnetization direction easier to be modified than that of the first magnetic layer; and an insulating layer disposed between the first magnetic layer and the second magnetic layer, wherein, when the magnetization direction of a second magnetic layer is parallel to the magnetization direction of a first magnetic layer, applying a first voltage across the first magnetic layer and the second magnetic layer so that the magnetization direction of the second magnetic layer is reversed by modifying the direction of the magnetization easy axis thereof, followed by the application of a second voltage having a smaller amplitude than that of the first voltage across the first magnetic layer and the second magnetic layer so that current flows from the first magnetic layer toward the second magnetic layer, and, when the magnetization direction of the second magnetic layer is antiparallel to the magnetization direction of the first magnetic layer, applying a third voltage across the first magnetic layer and the second magnetic layer so that the magnetization direction of the second magnetic layer is reversed by modifying the direction of the magnetization easy axis thereof, followed by the application of a fourth voltage having a smaller amplitude than that of the third voltage across the first magnetic layer and the second magnetic layer so that current flows from the second magnetic layer toward the first magnetic layer.

A control device for a magnetoresistance effect element according to the second invention comprises: a magnetoresistance effect element comprising a first magnetic layer, a second magnetic layer with the magnetization direction easier to be modified than that of the first magnetic layer, and an insulating layer disposed between the first magnetic layer and the second magnetic layer; and a control unit disposed so that, when the magnetization direction of a second magnetic layer is parallel to the magnetization direction of a first magnetic layer, a first voltage is applied across the first magnetic layer and the second magnetic layer so that the magnetization direction of the second magnetic layer is reversed by modifying the direction of the magnetization easy axis thereof, followed by the application of a second voltage having a smaller amplitude than that of the first voltage across the first magnetic layer and the second magnetic layer so that current flows from the first magnetic layer toward the second magnetic layer, and, when the magnetization direction of the second magnetic layer is antiparallel to the magnetization direction of the first magnetic layer, a third voltage is applied across the first magnetic layer and the second magnetic layer so that the magnetization direction of the second magnetic layer is reversed by modifying the direction of the magnetization easy axis thereof, followed by the application of a fourth voltage having a smaller amplitude than that of the third voltage across the first magnetic layer and the second magnetic layer so that current flows from the second magnetic layer toward the first magnetic layer.

In the control method for a magnetoresistance effect element according to the second invention, preferably, in the step of reversing the magnetization direction of the second magnetic layer, the direction of the magnetization easy axis in the second magnetic layer is modified by applying the first or third voltage across the first magnetic layer and the second magnetic layer and, when the magnetization of the second magnetic layer that performs precession with the modified magnetization easy axis as a center is reversed, the first voltage or the third voltage is switched to the second voltage or the fourth voltage. In the control device for a magnetoresistance effect element according to the second invention, preferably, the control unit is configured so that, in the step of reversing the magnetization direction of the second magnetic layer, the direction of the magnetization easy axis in the second magnetic layer is modified by applying the first or third voltage across the first magnetic layer and the second magnetic layer and, when the magnetization of the second magnetic layer that performs precession with the modified magnetization easy axis as the center is reversed, the first voltage or the third voltage is switched to the second voltage or the fourth voltage.

In the control method for a magnetoresistance effect element and the control device for a magnetoresistance effect element according to the second invention, information can be recorded on the magnetoresistance effect element by providing the second magnetic layer as a recording layer and rewriting the magnetization direction of the second magnetic layer so as to be parallel or antiparallel to the magnetization direction of the first magnetic layer. Here the expression "parallel to and antiparallel to the magnetization direction of the first magnetic layer" means an arrangement that is nearly parallel to the magnetization direction of the first magnetic layer and an arrangement that is nearly antiparallel to the magnetization direction of the first magnetic layer, respectively, and the angles are within ±30° to the substantially parallel and antiparallel directions, respectively. In the control method for a magnetoresistance effect element and the control device for a magnetoresistance effect element according to the second invention, when the magnetization direction of the second magnetic layer is disposed nearly parallel to or nearly antiparallel to the magnetization direction of the first magnetic layer, the magnetization direction of the second magnetic layer can be reversed by using the electric field induced magnetization reversal method. That is, the direction of the magnetization easy axis of the second magnetic layer can be modified by applying a first or third voltage across the first magnetic layer and the second magnetic layer, and the magnetization of the second magnetic layer performs precession with the modified magnetization easy axis as the center. When approximately half-cycle precession has been completed, switching to the second or fourth voltage having a smaller amplitude than the first or third voltage allows the magnetization easy axis of the second magnetic layer to be returned to the original direction to terminate the precession. Thus, the magnetization direction of the second magnetic layer is in an approximately half-cycle precession state and has been reversed to the original direction.

Next, the application of a second or fourth voltage across the first magnetic layer and the second magnetic layer allows the probability of success in the magnetization reversal to be enhanced through the utilization of the spin injection magnetization reversal method to perform stable magnetization reversal. When the magnetization direction of the original second magnetic layer is parallel to the magnetization direction of the first magnetic layer, in order to render the magnetization direction of the second magnetic layer parallel to the magnetization direction of the first magnetic layer, the second voltage is applied so that current flows from the first magnetic layer toward the second magnetic layer. Further, when the magnetization direction of the original second magnetic layer is antiparallel to the magnetization direction of the first magnetic layer, in order to render the magnetization direction of the second magnetic layer parallel to the magnetization direction of the first magnetic layer, a fourth voltage is applied from the second magnetic layer toward the first magnetic layer. Accordingly, the magnetization direction of the reversed second magnetic layer can be brought to a more nearly parallel or antiparallel state to the magnetization direction of the first magnetic layer.

Thus, in the control method for a magnetoresistance effect element and the control device for a magnetoresistance effect element according to the second invention, since the magnetization direction of the second magnetic layer is substantially reversed by using the electric field induced magnetization reversal method before the utilization of the spin injection magnetization reversal method, as compared with the utilization of only the spin injection magnetization reversal method, the writing speed is higher and the power consumption is lower. Further, after the reversal of the magnetization direction of the second magnetic layer by the electric field induced magnetization reversal method, the probability of success in the magnetization reversal by the spin injection magnetization reversal method can be enhanced, and, thus, there is no need to regulate the voltage application time with a high accuracy in the utilization of the electric field induced magnetization reversal method. Thus, the regulation by the electric field induced magnetization reversal method can be easily carried out, and, on the whole, a highly controllable stable magnetization reversal operation can be carried out.

In the control method for a magnetoresistance effect element and the control device for a magnetoresistance effect element according to the second invention, the magnetization reversal can be immediately started by utilizing the electric field induced magnetization reversal method before the utilization of the spin injection magnetization reversal method. For this reason, the dead time that has been occurred in the spin injection magnetization reversal method can be eliminated, making it possible to increase the writing speed. It is noted that the control unit that regulate the applied voltage may have any configuration. Preferably, however, the configuration of the control unit may be such that the first to fourth voltages are applied, for example, by applying a voltage from a direct current voltage source by switching regulated with a computer or the like through a transistor.

In the control method for a magnetoresistance effect element according to the second invention, preferably, a voltage equal to or larger than a predetermined magnitude is applied as the first voltage and the third voltage for a predetermined period of time to rotate the magnetization direction of the second magnetic layer by an angle of more than 90 degrees and less than 270 degrees from an original direction. Further, in the control device for a magnetoresistance effect element according to the second invention, preferably, the control unit is configured so that a voltage having a predetermined magnitude or larger is applied as the first voltage and the third voltage for a predetermined period of time to rotate the magnetization direction of the second magnetic layer by an angle of more than 90 degrees and less than 270 degrees from an original direction. More specifically, preferably, the first voltage and the third voltage have a magnitude large enough to modify the direction of the magnetization easy axis of the second magnetic layer and have a duration time of more than one-fourth cycle and less than three-fourth cycle of precession of the magnetization in the second magnetic layer. Accordingly, the magnetization direction of the second magnetic layer can be substantially reversed by using the electric field induced magnetization reversal method, and the magnetization reversal can be completed by the subsequent spin injection magnetization reversal method with a high probability and at a high speed.

The magnitude of the second voltage and the fourth voltage is preferably as large as possible as long as the direction of magnetization easy axis in the second magnetic layer does not change. Further, in order to improve the probability of success in writing of information, the duration time is preferably long. On the other hand, the duration time is preferably as short as possible from the viewpoints of an increased speed and a lowered power consumption.

In the control method for a magnetoresistance effect element and the control device for a magnetoresistance effect element according to the second invention, in order to reverse the magnetization in the second magnetic layer by the precession, the change in the direction of the magnetization easy axis in the second magnetic layer by the first voltage or the third voltage need to be more than 45 degrees and less than 135 degrees. Preferably, however, the change in direction of the magnetization easy axis in the second magnetic layer is 80 degrees to 100 degrees from the viewpoint of more reliably performing the magnetization reversal of the second magnetic layer.

In the control method for a magnetoresistance effect element and the control device for a magnetoresistance effect element according to the second invention, preferably, the first magnetic layer and the second magnetic layer are configured with a material containing at least one ferromagnetic metal element such as Co, Fe, Ni, and Mn. The layer thickness is not limited. However, when the easy magnetization direction is determined by interface magnetic anisotropy, the layer thickness in which the easy direction of magnetization can be switched by regulating magnetic anisotropy by voltage is preferable, and, for an example, 0.5 to 2 nm per CoFeB/MgO junction, is preferable. The insulating layer is preferably formed of a material containing one or more of nitrogen, fluorine and oxides such as MgO and AlO.

In the control method for a magnetoresistance effect element and the control device for a magnetoresistance effect element according to the second invention, the insulating layer is disposed between the first magnetic layer and the second magnetic layer along the layer thickness-wise direction of the first magnetic layer and the second magnetic layer. In this case, regulation can be easily carried out by applying a voltage across the first magnetic layer and the second magnetic layer. It is noted that in the first magnetic layer and the second magnetic layer, preferably, the magnetization direction is along the layer thickness-wise direction.

The control method for a magnetoresistance effect element according to the third invention is a control method in which the magnetoresistance effect element comprises: a first magnetic layer; a second magnetic layer, with the magnetization direction easier to be modified than that of the first magnetic layer; a non-magnetic layer disposed between the first magnetic layer and the second magnetic layer; a metallic layer disposed on the side opposite to the second magnetic layer relative to the first magnetic layer; and an insulating layer between the second magnetic layer and the metallic layer, comprises, when the magnetization direction of the second magnetic layer is parallel to the magnetization direction of the first magnetic layer, applying a first voltage across the second magnetic layer and the metallic layer to reverse the magnetization direction of the second magnetic layer by modifying the direction of the magnetization easy axis of the second magnetic layer, followed by the application of a second voltage having a smaller amplitude than that of the first voltage so that current flows from the first magnetic layer toward the second magnetic layer, and, when the magnetization direction of the second magnetic layer is antiparallel to the magnetization direction of the first magnetic layer, applying a third voltage across the second magnetic layer and the metallic layer to reverse the magnetization direction of the second magnetic layer by modifying the direction of the magnetization easy axis of the second magnetic layer, followed by the application of a fourth voltage having a smaller amplitude than that of the third voltage across the first magnetic layer and the second magnetic layer so that current flows from the second magnetic layer toward the first magnetic layer.

The control device for a magnetoresistance effect element according to the third invention comprises: a magnetoresistance effect element comprising a first magnetic layer, a second magnetic layer with the magnetization direction easier to be modified than that of the first magnetic layer, a non-magnetic layer disposed between the first magnetic layer and the second magnetic layer, a metallic layer disposed on the side opposite to the second magnetic layer relative to the first magnetic layer, and an insulating layer disposed between the second magnetic layer and the metallic layer; and a control unit provided so that, when the magnetization direction of a second magnetic layer is parallel to the magnetization direction of a first magnetic layer, a first voltage is applied across the second magnetic layer and the metallic layer to reverse the magnetization direction of the second magnetic layer by modifying the direction of the magnetization easy axis of the second magnetic layer, followed by the application of a second voltage having a smaller amplitude than that of the first voltage across the first magnetic layer and the second magnetic layer so that current flows from the first magnetic layer toward the second magnetic layer, and, when the magnetization direction of the second magnetic layer is antiparallel to the magnetization direction of the first magnetic layer, a third voltage is applied across the second magnetic layer and the metallic layer so that the magnetization direction of the second magnetic layer is reversed by modifying the direction of the magnetization easy axis thereof, followed by the application of a fourth voltage having a smaller amplitude than that of the third voltage across the first magnetic layer and the second magnetic layer so that current flows from the second magnetic layer toward the first magnetic layer.

In the control method for a magnetoresistance effect element according to the third invention, in the step of reversing the magnetization direction of the second magnetic layer, the direction of the magnetization easy axis in the second magnetic layer is modified by applying the first or third voltage across the second magnetic layer and the metallic layer and, when the magnetization of the second magnetic layer that performs precession with the modified magnetization easy axis as the center is reversed, the first voltage or the third voltage is switched to the second voltage or the fourth voltage. In the control device for a magnetoresistance effect element according to the third invention, the control unit is preferably configured so that, in the step of reversing the magnetization direction of the second magnetic layer, the direction of the magnetization easy axis in the second magnetic layer is modified by applying the first or third voltage across the second magnetic layer and the metallic layer and, when the magnetization of the second magnetic layer that performs precession with the modified magnetization easy axis as the center is reversed, the first voltage or the third voltage is switched to the second voltage or the fourth voltage.

In the control method for a magnetoresistance effect element and the control device for a magnetoresistance effect element according to the third invention, information can be recorded on the magnetoresistance effect element by providing the second magnetic layer as a recording layer and rewriting the magnetization direction of the second magnetic layer to a parallel state or an antiparallel state to the magnetization direction of the first magnetic layer. Here the expression "a parallel state and an antiparallel state to the magnetization direction of the first magnetic layer" means an arrangement that is nearly parallel to the magnetization direction of the first magnetic layer and an arrangement that is nearly antiparallel to the magnetization direction of the first magnetic layer, respectively, and the angles are within ±30° to the substantially parallel and antiparallel directions, respectively. In the control method for a magnetoresistance effect element and the control device for a magnetoresistance effect element according to the third invention, the magnetoresistance effect element has a combined structure of a configuration that comprises a first magnetic layer, a non-magnetic layer, and a second magnetic layer and utilizes a spin injection magnetization reversal method illustrated in FIG. 11, and a configuration that comprises a second magnetic layer, an insulating layer, and a metallic layer and utilizes an electric field induced magnetization reversal method illustrated in FIG. 12, the second magnetic layer being common to the both configurations illustrated in FIGS. 11 and 12.

In the control method for a magnetoresistance effect element and the control device for a magnetoresistance effect element according to the third invention, the magnetization direction of the second magnetic layer is first reversed through the utilization of an electric field induced magnetization reversal method by applying a first or third voltage across the second ferromagnetic layer and the metallic layer, followed by the application of a second or fourth voltage across the first magnetic layer and the second magnetic layer to enhance the probability of success in magnetization reversal through the utilization of a spin injection magnetization reversal method, whereby a stable magnetization reversal can be carried out. Thus, in the control method for a magnetoresistance effect element and the control device for a magnetoresistance effect element according to the third invention, the magnetization reversal operation can be carried out on the same principle as the control method for a magnetoresistance effect element and the control device for a magnetoresistance effect element according to the second invention, and, as compared with the utilization of only the spin injection magnetization reversal method, the writing speed is higher, the power consumption is lower, and the controllability is higher than that in the electric field induced magnetization reversal method. Other features and effects obtained are also the same as those obtained in the control method for a magnetoresistance effect element and the control device for a magnetoresistance effect element according to the second invention.

In the control method for a magnetoresistance effect element and the control device for a magnetoresistance effect element according to the third invention, the first magnetic layer and the second magnetic layer are preferably configured with a material containing at least one ferromagnetic metal element such as Co, Fe, Ni, and Mn. The layer thickness is not limited, however, when the magnetization easy direction is determined by interface magnetic anisotropy, the layer thickness in which the magnetization easy axis direction can be switched by regulating magnetic anisotropy by voltage is preferable, and, for example, 0.5 to 2 nm per CoFeB/MgO junction is preferable. The non-magnetic layer formed of any material can be used. The thickness of the non-magnetic layer is preferably approximately 3 nm or more from the viewpoint of breaking an exchange coupling between the first magnetic layer and the second magnetic layer. The metallic layer is preferably formed of, for example, a low-resistance material such as Au, Cr, Cu, or Al. The insulating layer is preferably formed of a material containing one or more of nitrogen, fluorine and oxides such as MgO and AlO. The thickness of the insulating layer is one having a high resistance, preferably not less than 2 nm, from the viewpoint of preventing an energy loss by Joule heat.

In the control method for a magnetoresistance effect element and the control device for a magnetoresistance effect element according to the third invention, preferably, the non-magnetic layer is disposed between the first magnetic layer and the second magnetic layer along the layer thickness-wise direction of the first magnetic layer and the second magnetic layer, and the insulating layer and the metallic layer are stacked on the side opposite to the first magnetic layer relative to the second magnetic layer along the layer thickness-wise direction of the first magnetic layer and the second magnetic layer. In this case, regulation can be easily carried out by applying a voltage across the first magnetic layer and the second magnetic layer and across the second magnetic layer and the metallic layer. In the first magnetic layer and the second magnetic layer, preferably, magnetization direction is along the layer thickness-wise direction.

Advantageous Effect of Invention

The present invention can provide a control method for a magnetoresistance effect element and a control device for a magnetoresistance effect element that provide a higher writing speed and a lower power consumption than a spin injection magnetization reversal method, and, at the same time, can realize a highly controllable and stable magnetization reversal operation.

DESCRIPTION OF EMBODIMENTS

Embodiments of the present invention will be described with reference to the accompanying drawings.

FIGS. 1 to 7 illustrate magnetoresistance effect elements used in a control method for a magnetoresistance effect element and a control device for a magnetoresistance effect element in an embodiment of the first invention.

Figure 1:
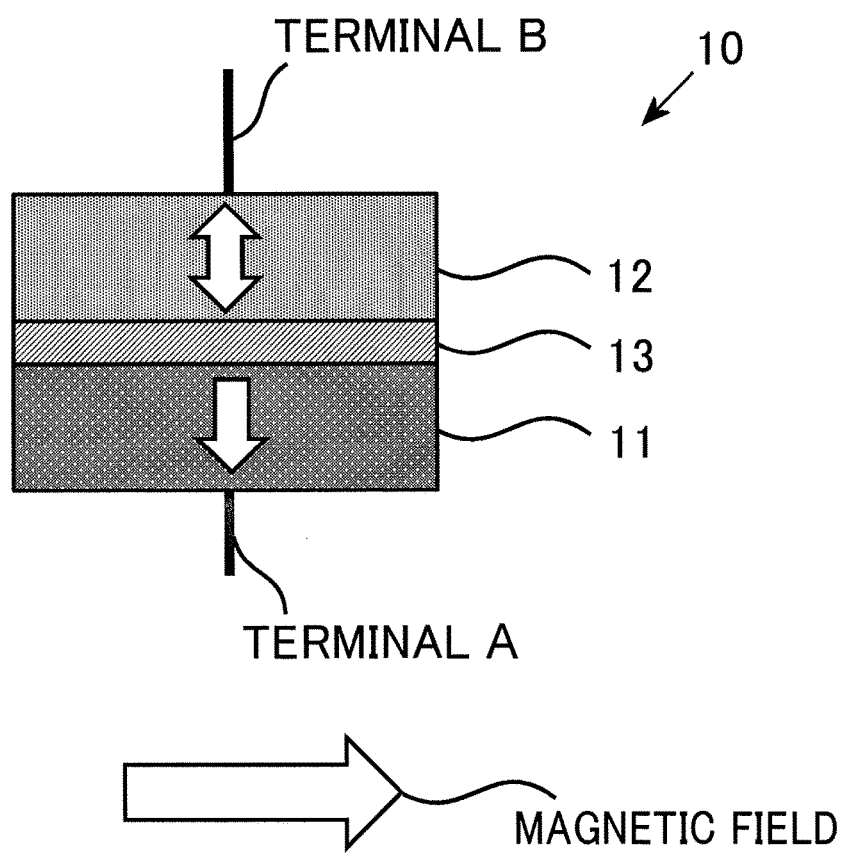
FIG. 1 is a vertical cross-sectional view illustrating a magnetoresistance effect element used in a control method for a magnetoresistance effect element and a control device for a magnetoresistance effect element in an embodiment of the first invention.

As illustrated in FIG. 1, this magnetoresistance effect element 10 comprises a first magnetic layer 11, a second magnetic layer 12, and an insulating layer 13.

In the first magnetic layer 11, the magnetization direction is along the layer thickness-wise direction of the layer and does not undergo a change by not less than 90 degrees. In the second magnetic layer 12, the magnetization direction is along the layer thickness-wise direction and can be modified to a near parallel arrangement or a near antiparallel arrangement 2 to the magnetization direction of the first magnetic layer 11. The insulating layer 13 is disposed between the first magnetic layer 11 and the second magnetic layer 12 along the layer thickness-wise direction of the first magnetic layer 11 and the second magnetic layer 12.

A control method for a magnetoresistance effect element 10 will be described with reference to an embodiment using a magnetoresistance effect element 10a illustrated in FIG. 2. The magnetoresistance effect element 10a illustrated in FIG. 2 comprises a 0.9 nm-thick CoFeB layer as a first magnetic layer 11, a 1.8 nm-thick CoFeB layer as a second magnetic layer 12, and a 1.3 nm-thick MgO layer as an insulating layer 13. Further, a Ta layer, an Ru layer, a Ta layer, and a sapphire layer (sapphire sub.) are provided in this order from the above under the first magnetic layer 11. Furthermore, a Ta layer, an Ru layer, and a Cr/Au layer are provided in this order from below on the second magnetic layer 12. Further, an AlO protective insulating layer is provided around the junction area.

In the control method for a magnetoresistance effect element and the control device for a magnetoresistance effect element in an embodiment of the first invention, information can be recorded on a magnetoresistance effect element 10 by providing a second magnetic layer 12 as a recording layer and rewriting the magnetization direction of the second magnetic layer 12 to a near parallel arrangement or a near antiparallel arrangement relative to the magnetization direction of the first magnetic layer 11. Firstly, when the magnetization direction of the second magnetic layer 12 is nearly parallel to the magnetization direction of the first magnetic layer 11, a first voltage is applied across the terminal A and the terminal B, that is, across the first magnetic layer 11 and the second magnetic layer 12. The first voltage has a magnitude large enough to modify the direction of the magnetization easy axis in the second magnetic layer 12. Accordingly, an effective magnetic field in a direction indicated by an arrow in FIG. 1 is relatively larger than an effective magnetic field in a perpendicular direction that has existed before the application of the voltage, and the direction of the magnetization easy axis in the second magnetic layer 12 is modified substantially perpendicularly from the perpendicular direction to an in-plane direction of the layer. The magnetization in the second magnetic layer 12 performs precession with the modified magnetization easy axis as the center.

Figure 2:
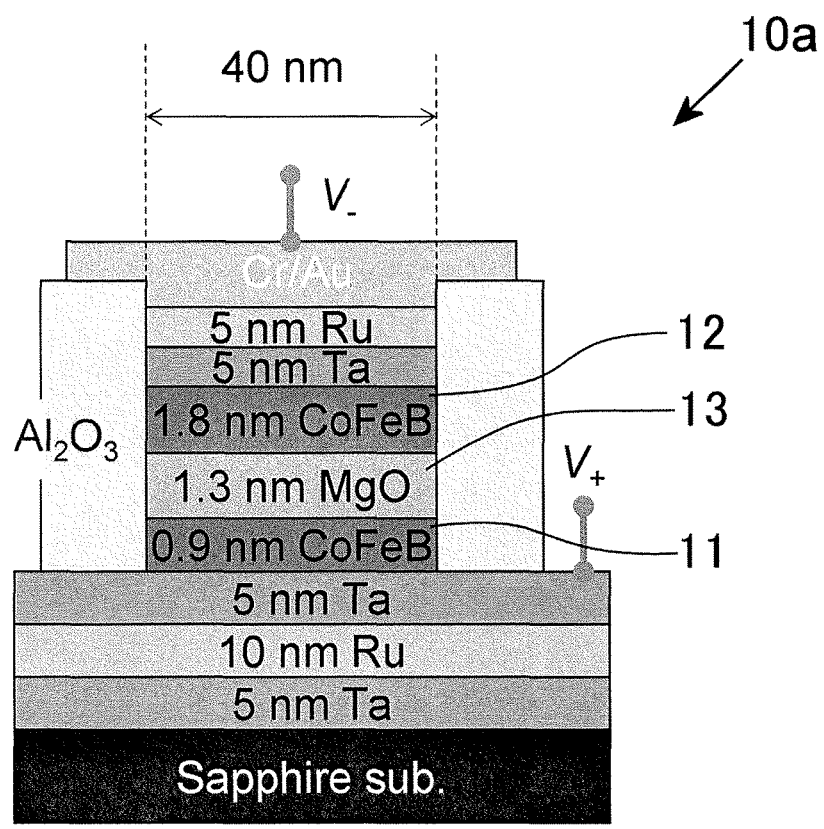
FIG. 2 is a vertical cross-sectional view of an embodiment of the magnetoresistance effect element illustrated in FIG. 1.
Figure 3:
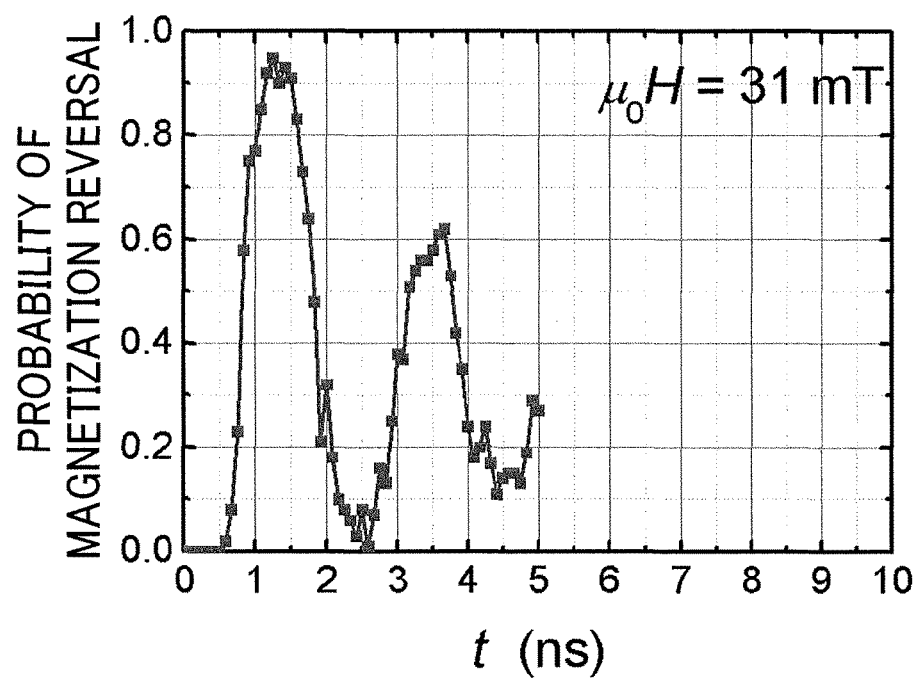
FIG. 3 is a graph illustrating dependency of the probability of magnetization reversal in the second magnetic layer on voltage application duration time when a first voltage is applied to the magnetoresistance effect element illustrated in FIG. 2.

In the magnetoresistance effect element 10a illustrated in FIG. 2, when a voltage of 0.7 V is applied as a first voltage across the first magnetic layer 11 and the second magnetic layer 12, since the magnetization of the second magnetic layer 12 performs precession, as illustrated in FIG. 3, the probability of the magnetization reversal vibrates against the voltage application duration time. It is noted that the probability of the magnetization reversal illustrated in FIG. 3 shows a probability of the modification of magnetization direction of the second magnetic layer 12 to a nearly antiparallel state to the magnetization direction of the first magnetic layer 11 upon the application of a voltage when the magnetization direction of the second magnetic layer 12 is nearly parallel to the magnetization direction of the first magnetic layer 11. Further, in FIG. 3, the magnetic flux density and the duration time of the applied magnetic field is 31 mT and up to 5 ns, respectively. When the voltage is dropped to a value that does not cause a change in magnetization easy axis in the second magnetic layer 12 or a lower value at a point where the magnetization in the second magnetic layer 12 has performed approximately half-cycle precession, that is, around 1.25 ns that is a time at which the probability of reversal is the highest, the magnetization easy axis in the second magnetic layer 12 can be returned to the original direction to terminate the precession. By virtue of this, the magnetization direction of the second magnetic layer 12 is in an approximately half-cycle precession state and is in a substantially reversed state to the original direction, that is, is substantially antiparallel to the magnetization direction of the first magnetic layer 11. Thus, the magnetization direction of the second magnetic layer 12 can be substantially reversed through the utilization of the electric field induced magnetization reversal method.

Next, a second voltage having a smaller amplitude than the first voltage is applied across the first magnetic layer 11 and the second magnetic layer 12 so that current flow from the first magnetic layer 11 toward the second magnetic layer 12. The amplitude of the second voltage is a value that does not cause a change in magnetization easy axis in the second magnetic layer 12. Preferably, the second voltage is applied following the first voltage. The application of the second voltage allows the magnetization direction of the reversed second magnetic layer 12 to be more nearly antiparallel to the magnetization direction in the first magnetic layer 11.

Figure 4:
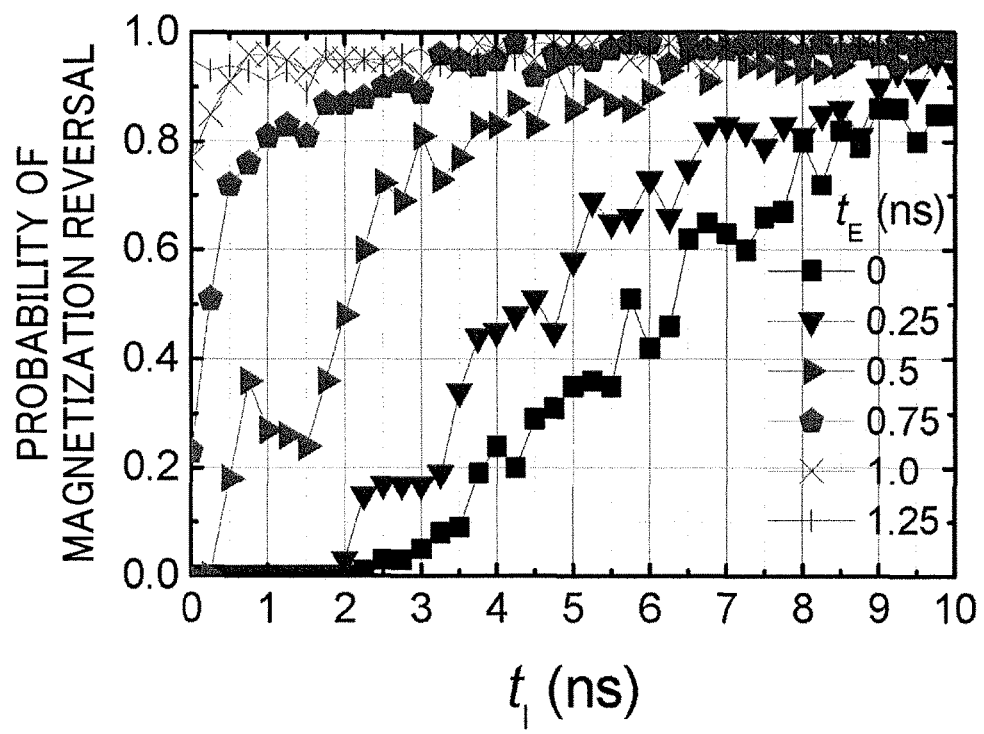
FIG. 4 is a graph illustrating the probability of magnetization reversal in the second magnetic layer plotted against duration time $t_1$ of the second voltage for various first voltage duration times $t_E$ in the magnetoresistance effect element illustrated in FIG. 2.

The results of the determination of the probability of reversal by applying a voltage of 0.5 V as the second voltage to the magnetoresistance effect element 10a illustrated in FIG. 2 are illustrated in FIG. 4. FIG. 4 illustrates a change in probability of magnetization reversal plotted against the duration time $t_1$ of the second voltage (0.5 V) with the duration time $t_E$ of the first voltage (0.7 V) applied being varied from 0 ns to 1.25 ns. The probability of magnetization reversal illustrated in FIG. 4 shows a probability of the modification of magnetization direction of the second magnetic layer 12 to an antiparallel state to the magnetization direction of the first magnetic layer 11 upon the application of a voltage when the magnetization direction of the second magnetic layer 12 is nearly parallel to the magnetization direction of the first magnetic layer 11. As illustrated in FIG. 4, the application of the second voltage allows the magnetization direction of the second magnetic layer 12 to be brought to a more nearly antiparallel state to the magnetization direction of the first magnetic layer 11. When the duration time $t_E$ of the first voltage is closer to the time (1.25 ns) illustrated in FIG. 3 at which the probability of the magnetization reversal is the highest, the probability of the magnetization reversal by the second voltage can be more quickly enhanced.

As illustrated in FIG. 4, for any $t_E$, the probability of the magnetization reversal is increased by increasing $t_1$. This reveals that a torque which directs magnetization to an antiparallel arrangement (a force that acts on magnetization) is provided by spin injection. Thus, the application of the second voltage following the application of the first voltage can realize an enhancement in probability of success in magnetization reversal through the utilization of the spin injection magnetization reversal method, contributing to a stable magnetization reversal.

It is noted that the results of $t_E=0$ ns illustrated in FIG. 4 correspond to the results of spin injection magnetization reversal method without the utilization of the electric field induced magnetization reversal method. In this case, even when $t_1=10$ ns, the probability of magnetization reversal does not reach 0.9. By contrast, when $t_E=1.25$ ns, even in $t_1=0$ ns, the probability of magnetization reversal already exceeds 0.9. This demonstrates that, when a probability of magnetization reversal of 0.9 (90%) is ensured, the whole writing time $t_E+t_1$ can be shortened by 8.75 ns or more as compared with the case where only spin injection magnetization reversal is utilized.

Figure 5:
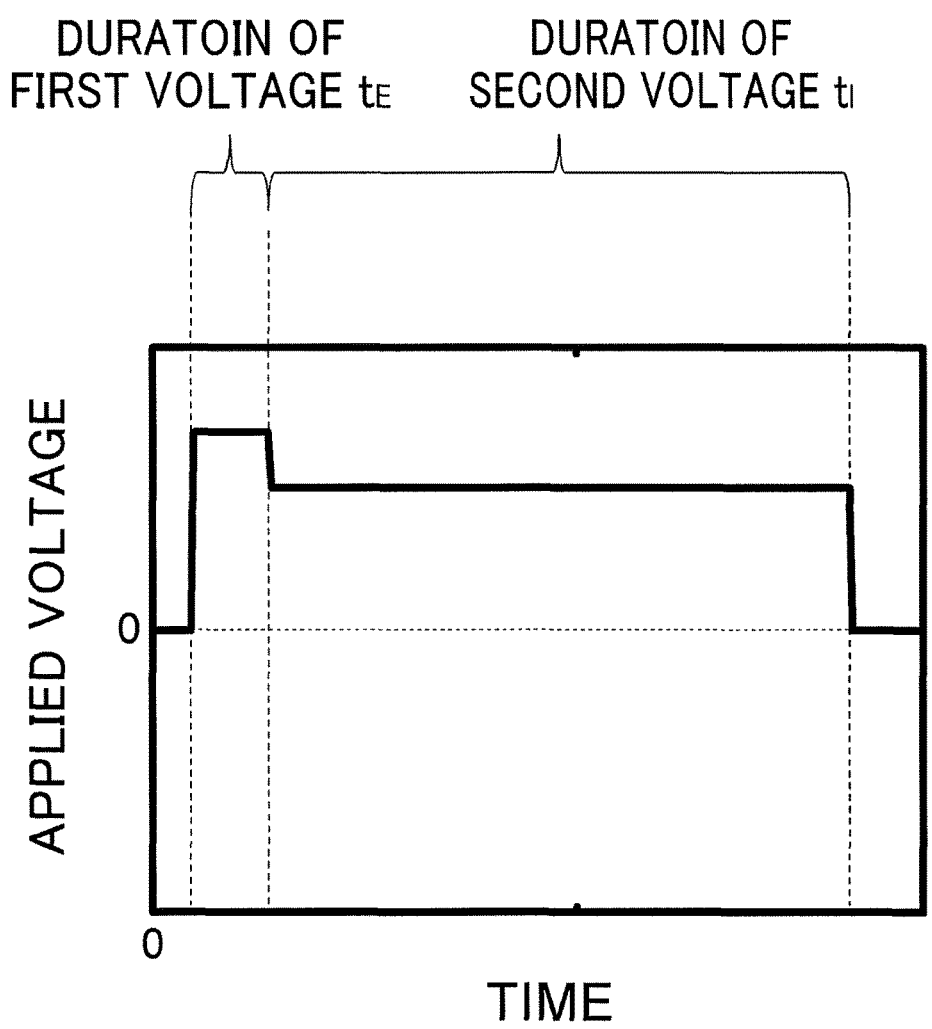
FIG. 5 is a graph illustrating an applied voltage waveform in rewriting the magnetization direction of the second magnetic layer from a near parallel state to a near antiparallel state to the magnetization direction of the first magnetic layer in the magnetoresistance effect element illustrated in FIG. 1.

As is apparent from the foregoing description, in the control method for a magnetoresistance effect element and the control device for a magnetoresistance effect element in an embodiment of the first invention, as illustrated in FIG. 5, the application of the first voltage in duration time $t_E$ followed by the application of the second voltage in duration time $t_1$ allows the magnetization direction of the second magnetic layer 12 to be rewritten from a nearly parallel state to a nearly antiparallel state to the magnetization direction of the first magnetic layer 11.

Next, also when the magnetization direction of the second magnetic layer 12 is arranged nearly antiparallel to the magnetization direction of the first magnetic layer 11, the magnetization can be rewritten to a nearly parallel state on the same principle as in rewriting of the nearly parallel arrangement to the nearly antiparallel arrangement. That is, at the outset, a third voltage is applied across the terminal A and the terminal B, that is, across the first magnetic layer 11 and the second magnetic layer 12. Preferably, the third voltage has the same polarity and magnitude as the first voltage. In this case, an effective magnetic field occurs in a direction indicted by an arrow in FIG. 1, and the direction of the magnetization easy axis in the second magnetic layer 12 is modified substantially perpendicularly from the perpendicular direction to an in-plane direction of the layer. The magnetization in the second magnetic layer 12 performs precession with the modified magnetization easy axis as the center.

When the voltage is changed to a value that does not cause a change in magnetization easy axis in the second magnetic layer 12 at a point where the magnetization in the second magnetic layer 12 has performed approximately half-cycle precession, the magnetization easy axis in the second magnetic layer 12 can be returned to the original direction to terminate the precession. Accordingly, the magnetization direction of the second magnetic layer 12 is in an approximately half-cycle precession state and is in a substantially reversed state to the original direction, that is, is substantially parallel to the magnetization direction of the first magnetic layer 11. Thus, the magnetization direction of the second magnetic layer 12 can be substantially reversed through the utilization of the electric field induced magnetization reversal method.

Next, a fourth voltage that is lower than the third voltage is applied across the first magnetic layer 11 and the second magnetic layer 12 so that current flows from the second magnetic layer 12 toward the first magnetic layer 11. The fourth voltage is a value that does not cause a change in magnetization easy axis in the second magnetic layer 12. Preferably, the fourth voltage is applied following the application of the third voltage. The polarity of the fourth voltage is opposite to the polarity of the second voltage. The application of the fourth voltage can render the magnetization direction of the reversed second magnetic layer 12 more nearly parallel to the magnetization direction of the first magnetic layer 11. Thus, the application of the fourth voltage following the application of the third voltage can realize an enhancement in probability of success in magnetization reversal through the utilization of the spin injection magnetization reversal method, contributing to a stable magnetization reversal.

Figure 6:
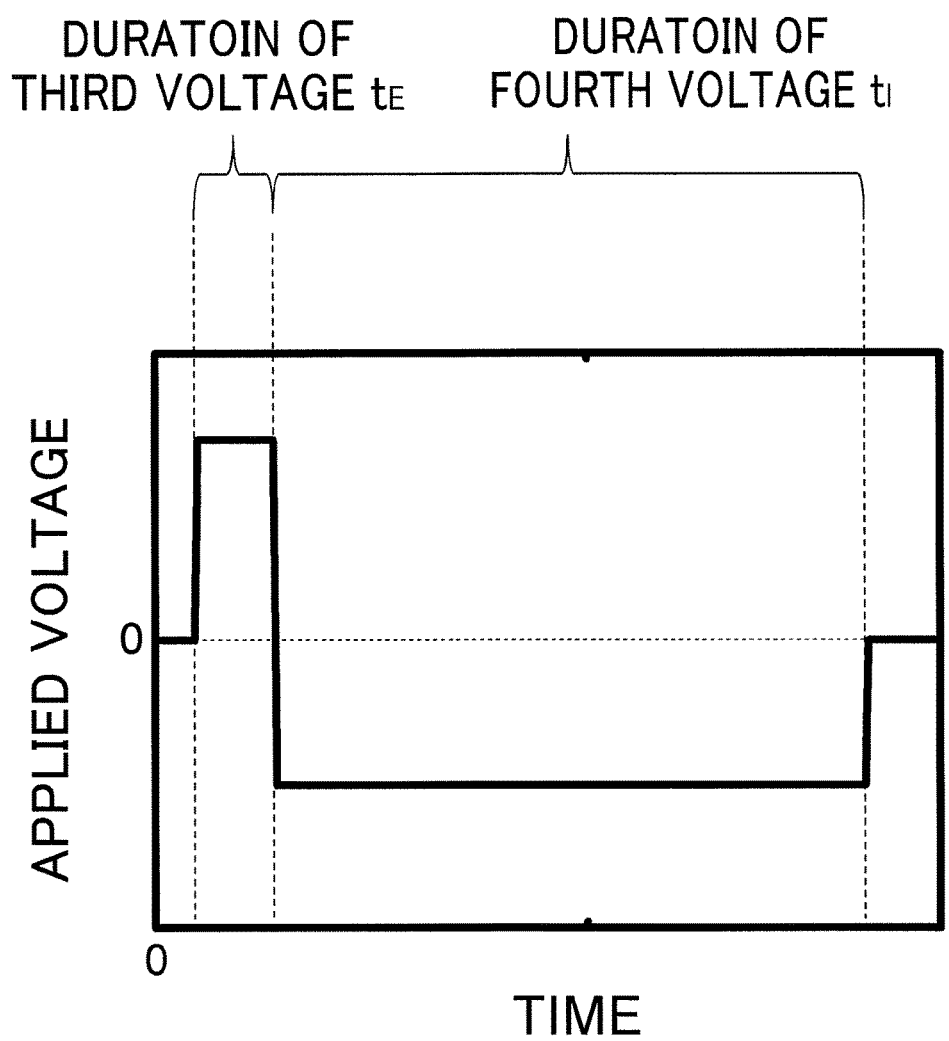
FIG. 6 is a graph illustrating an applied voltage waveform in rewriting the magnetization direction of the second magnetic layer from a near antiparallel state to a near parallel state to the magnetization direction of the first magnetic layer in the magnetoresistance effect element illustrated in FIG. 1.

As is apparent from the foregoing description, in the control method for a magnetoresistance effect element and the control device for a magnetoresistance effect element in an embodiment of the first invention, as illustrated in FIG. 6, the application of the third voltage in duration time $t_E$ followed by the application of the fourth voltage in duration time $t_1$ allows the magnetization direction of the second magnetic layer 12 to be rewritten from a nearly antiparallel state to a nearly parallel state to the magnetization direction of the first magnetic layer 11.

Figure 7:
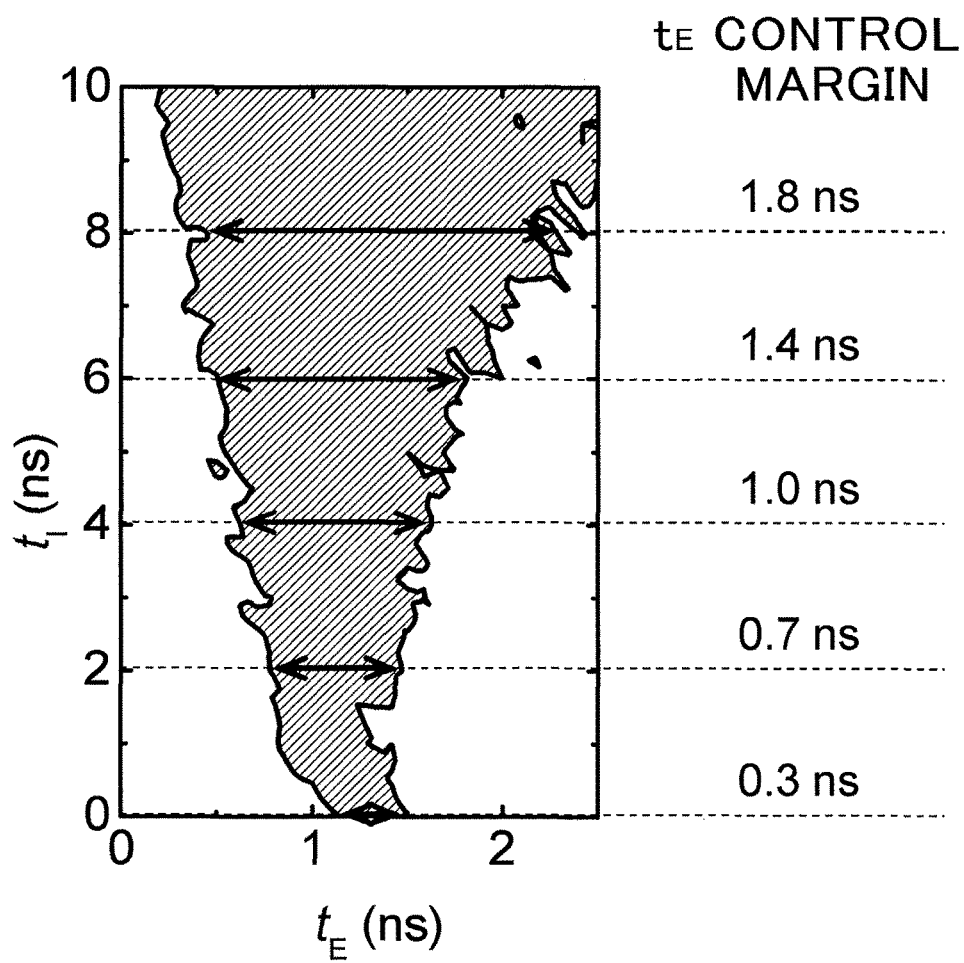
FIG. 7 is a graph illustrating a region of a first voltage duration time $t_E$ and a second voltage duration time $t_1$ when the probability of the magnetization reversal is not less than 90%, in the magnetoresistance effect element illustrated in FIG. 2.

A region of $t_E$ and $t_1$ where the probability of the magnetization reversal is not less than 90% for the magnetoresistance effect element 10a illustrated in FIG. 2 are determined, and the results are illustrated in FIG. 7. In FIG. 7, $t_E=0$ (on ordinate) where only a spin injection magnetization reversal method is utilized corresponds to $t_1=0$ (on abscissa) where only an electric field induced magnetization reversal method is utilized. When a probability of magnetization reversal of not less than 90% is ensured, in $t_1=0$ where only the electric field induced magnetization reversal method is utilized, the voltage need be regulated in $t_E=1.1$ ns to 1.4 ns. In this case, the acceptable error is only 0.3 ns. By contrast, when a combination of the spin injection magnetization reversal method with the electric field induced magnetization reversal method is utilized, for example, in $t_1=4$ ns, the acceptable error (regulation margin) is 1.0 ns, contributing to a significant improvement in controllability over the case where only the electric field induced magnetization reversal method is utilized.

When a probability of magnetization reversal of not less than 90% is ensured, in $t_E=0$ where only the spin injection magnetization reversal method is utilized, a writing time $t_E(=0)+t_1$ of not less than 10 nm is necessary. By contract, when a combination of the spin injection magnetization reversal method with the electric field induced magnetization reversal method is utilized, for example, in $t_1=4$ ns, the writing time $t_E+t_1$ is 4.6 to 5.6 ns, demonstrating that the writing time can be shortened by 4 to 5 ns or more as compared with the case where only the spin injection magnetization reversal method is utilized. Further, since the energy consumption in the spin injection magnetization reversal method is proportional to the writing time, the power consumption can be reduced by an increasing the speed.

Thus, in the control method for a magnetoresistance effect element and the control device for a magnetoresistance effect element in an embodiment of the first invention, since the magnetization direction of the second magnetic layer 12 is substantially reversed by using the electric field induced magnetization reversal method before the utilization of the spin injection magnetization reversal method, as compared with the case where only the spin injection magnetization reversal method is utilized, the writing speed is higher and the power consumption is lower. Further, after the reversal of magnetization direction of the second magnetic layer 12 by the electric field induced magnetization reversal method, the probability of success in magnetization reversal can be enhanced by the spin injection magnetization reversal method, and, thus, there is no need to perform a highly accurate magnetization reversal in utilizing the electric field induced magnetization reversal method. Therefore, regulation by the electric field induced magnetization reversal method can be easily carried out, and, on the whole, a highly controllable and stable magnetization reversal operation can be performed.

In the control method for a magnetoresistance effect element and the control device for a magnetoresistance effect element in an embodiment of the first invention, when the electric field induced magnetization reversal method is utilized before the utilization of the spin injection magnetization reversal method, the magnetization reversal can be immediately started. Accordingly, a dead time that has occurred in the spin injection magnetization reversal method is eliminated, and the writing speed can be increased.

In the control method for a magnetoresistance effect element and the control device for a magnetoresistance effect element on an embodiment of the first invention, in order to substantially reverse the magnetization direction of the second magnetic layer 12 by utilizing the electric field induced magnetization reversal method, preferably, the first voltage and the third voltage are applied for a period of time in which the magnetization direction of the second magnetic layer 12 is rotated by an angle of more than 90 degrees and less than 270 degrees from an original direction, that is, for a duration time of more than one-fourth cycle precession and less than three-fourth cycle precession of magnetization in the second magnetic layer 12. Thus, the magnetization reversal can be completed by the subsequent spin injection magnetization reversal method with a high probability at a high speed.

In the control method for a magnetoresistance effect element and the control device for a magnetoresistance effect element in an embodiment of the first invention, the magnitude of the second voltage and the fourth voltage is preferably as large as possible as long as the direction of magnetization easy axis in the second magnetic layer does not change. In order to improve the probability of success in writing of information, the duration time is preferably long. On the other hand, the duration time is preferably as short as possible from the viewpoints of an increased speed and a lowered power consumption. The control device for a magnetoresistance effect element in an embodiment of the first invention is configured so that the magnetoresistance effect element 10 is regulated by a control unit.

Figure 8:
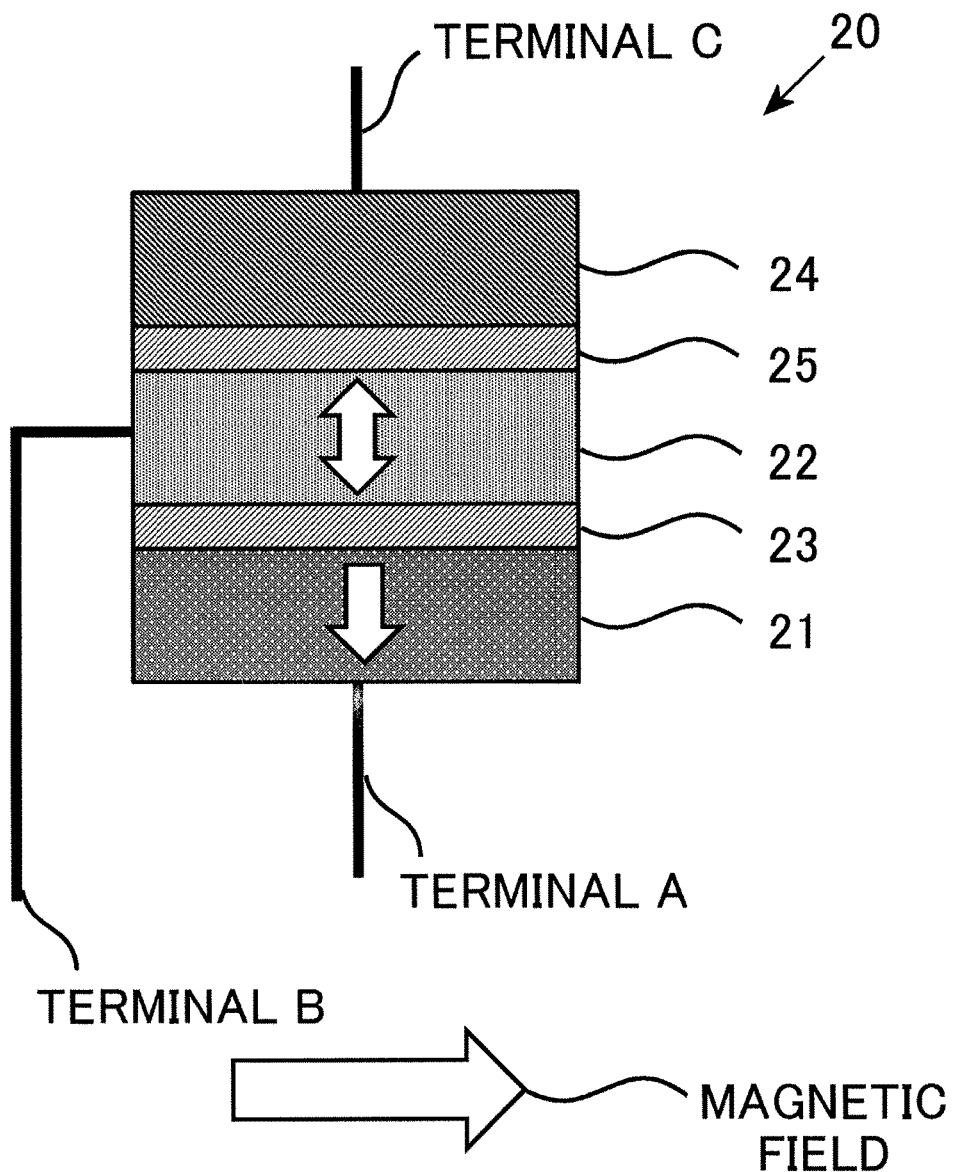
FIG. 8 is a vertical cross-sectional view of a magnetoresistance effect element used in a control method for a magnetoresistance effect element and a control device for a magnetoresistance effect element in an embodiment of the second invention.
Figure 9:
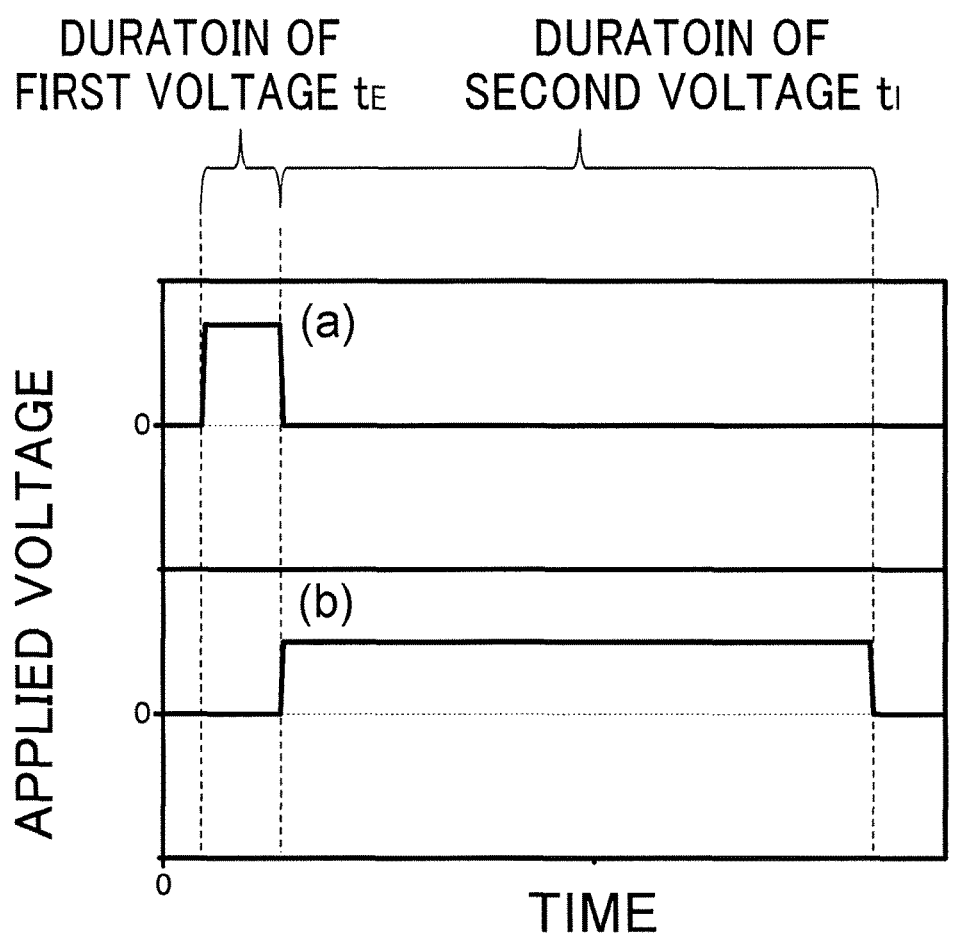
FIG. 9 is a graph illustrating an applied voltage across (a) terminal B and terminal C and (b) terminal A and terminal B in rewriting the magnetization direction of the second magnetic layer from a parallel state to an antiparallel state to the magnetization direction of the first magnetic layer in the magnetoresistance effect element illustrated in FIG. 8.
Figure 10:
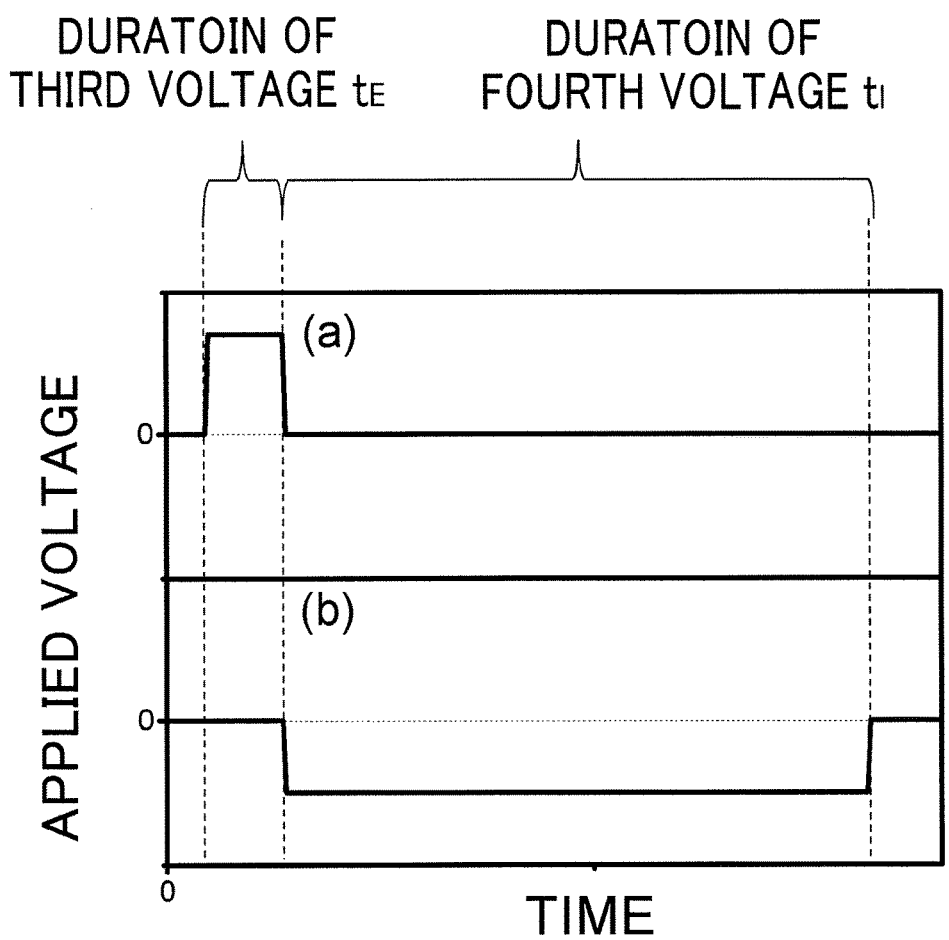
FIG. 10 is a graph illustrating an applied voltage across (a) terminal B and terminal C and (b) terminal A and terminal B in rewriting the magnetization direction of the second magnetic layer from an antiparallel state to a parallel state to the magnetization direction of the first magnetic layer in the magnetoresistance effect element illustrated in FIG. 8.

FIGS. 8 to 10 illustrate a magnetoresistance effect element used in the control method for a magnetoresistance effect element and the control device for a magnetoresistance effect element in an embodiment of the second invention.

As illustrated in FIG. 8, a magnetoresistance effect element 20 comprises a first magnetic layer 21, a second magnetic layer 22, a non-magnetic layer 23, a metallic layer 24, and an insulating layer 25.

The magnetization direction of the first magnetic layer 21 is more difficult to modify than the magnetization direction of the second magnetic layer. In the second magnetic layer 22, modifying magnetization direction to a nearly parallel arrangement or a nearly antiparallel arrangement to the magnetization direction of the first magnetic layer 21 is easier than the first magnetic layer. The non-magnetic layer 23 is disposed between the first magnetic layer 21 and the second magnetic layer 22 along the layer thickness-wise direction of the first magnetic layer 21 and the second magnetic layer 22. The metallic layer 24 is disposed on the side opposite to the first magnetic layer 21 relative to the second magnetic layer 22. The insulating layer 25 is disposed between the second magnetic layer 22 and the metallic layer 24 along the layer thickness-wise direction of the first magnetic layer 21 and the second magnetic layer 22.

Figure 11:
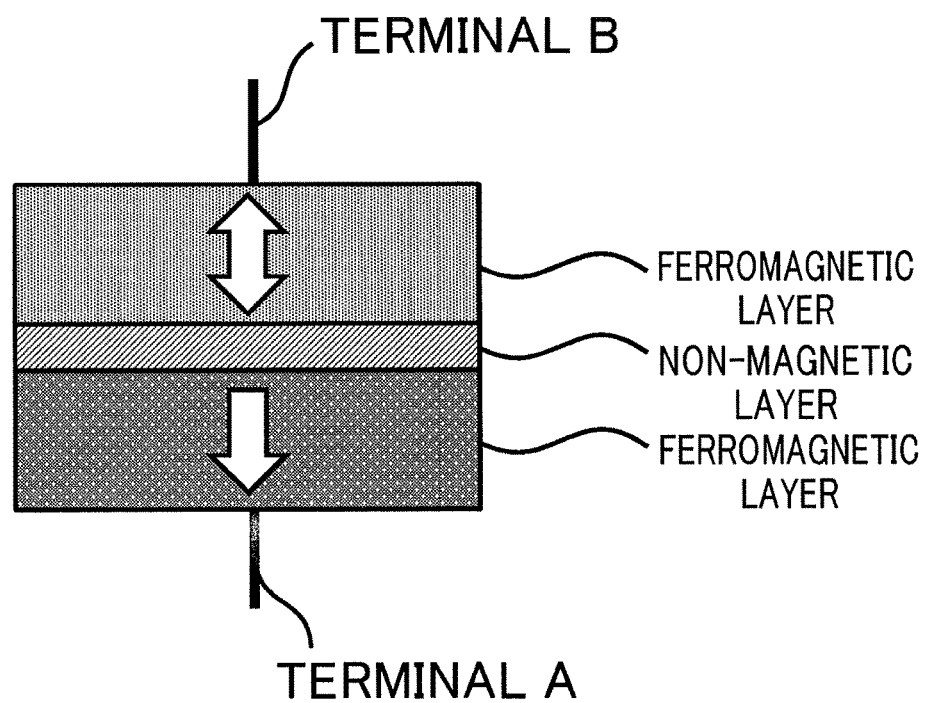
FIG. 11 is a vertical cross-sectional view illustrating a magnetoresistance effect element used in a conventional spin injection magnetization reversal method.
Figure 12:
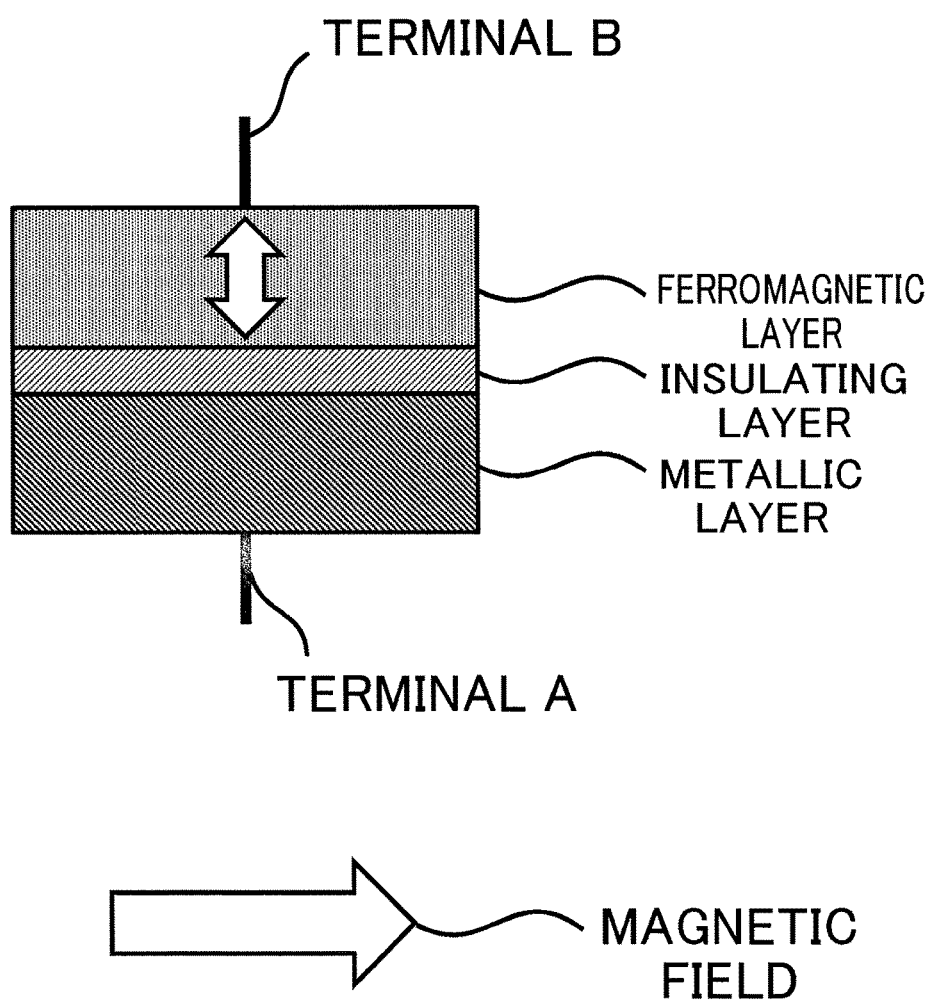
FIG. 12 is a vertical cross-sectional view illustrating a magnetoresistance effect element used in a conventional electric field induced magnetization reversal method.

The magnetoresistance effect element 10 has a combined structure of a configuration that comprises a first magnetic layer 21, a non-magnetic layer 23, and a second magnetic layer 22 and utilizes a spin injection magnetization reversal method illustrated in FIG. 11, and a configuration that comprises a second magnetic layer 22, an insulating layer 25, and a metallic layer 24 and utilizes an electric field induced magnetization reversal method illustrated in FIG. 12, the second magnetic layer 22 being common to the both configurations illustrated in FIGS. 11 and 12.

In the control method for a magnetoresistance effect element and the control device for a magnetoresistance effect element in an embodiment of the second invention, information can be recorded on the magnetoresistance effect element 20 by providing the second magnetic layer 22 as a recording layer and rewriting the magnetization direction of the second magnetic layer 22 to a nearly parallel arrangement or a nearly antiparallel arrangement to the magnetization direction of the first magnetic layer 21. In the control method for a magnetoresistance effect element and the control device for a magnetoresistance effect element in an embodiment of the second present invention, the magnetization reversal operation can be carried out on the same principle as the control method for a magnetoresistance effect element and the control device for a magnetoresistance effect element in an embodiment of the first invention. In the following description, the description of a portion overlapped with the control method for a magnetoresistance effect element and the control device for a magnetoresistance effect element in an embodiment of the first invention will be omitted.

Specifically, at the outset, when the magnetization direction of the second magnetic layer 22 is parallel to the magnetization direction of the first magnetic layer 21, as illustrated in FIG. 9, a first voltage is applied across the terminal B and the terminal C, that is, across the second magnetic layer 22 and metallic layer 24. Accordingly, an effective magnetic field occurs in a direction indicated by an arrow in FIG. 8, the direction of the magnetization easy axis in the second magnetic layer 22 is modified substantially perpendicularly to the in-plane direction of the layer from a perpendicular direction, and the magnetization of the second magnetic layer 22 performs precession with the modified magnetization easy axis as the center. When approximately half-cycle precession is performed, the application of the first voltage is stopped, followed by the application of a second voltage having a smaller amplitude than the first voltage across the terminal A and the terminal B, that is, across the first magnetic layer 21 and the second magnetic layer 22. Accordingly, the magnetization easy axis in the second magnetic layer 22 is returned to the original direction to terminate the precession, and the magnetization direction of the second magnetic layer 22 can be brought to a substantially reversed state to the original direction, that is, can be brought to a substantially antiparallel state to the magnetization direction of the first magnetic layer 21.

The application of the first voltage followed by the application of the second voltage so that current flows from the first magnetic layer 21 toward the second magnetic layer 22 can render the magnetization direction of the reversed second magnetic layer 22 more nearly antiparallel to the magnetization direction of the first magnetic layer 21.

Thus, in the control method for a magnetoresistance effect element and the control device for a magnetoresistance effect element in an embodiment of the second invention, as illustrated in FIG. 9, the application of the first voltage for a duration time $t_E$ followed by the application of the second voltage for a duration time t1 allows the magnetization direction of the second magnetic layer 22 to be rewritten from a nearly parallel state to a nearly antiparallel state to the magnetization direction of the first magnetic layer 21.

Next, also when the magnetization direction of the second magnetic layer 22 is arranged nearly antiparallel to the magnetization direction of the first magnetic layer 21, the magnetization direction can be rewritten to a nearly parallel arrangement on the same principle as rewriting from a nearly parallel arrangement to a nearly antiparallel arrangement. Specifically, as illustrated in FIG. 10, a third voltage is applied across the terminal B and the terminal C, that is, across the second magnetic layer 22 and the metallic layer 24. Thus, an effective magnetic field occurs in a direction indicated by an arrow in FIG. 8, the direction of the magnetization easy axis in the second magnetic layer 22 is modified substantially perpendicularly from a perpendicular direction to an in-plane direction of the layer, and the magnetization in the second magnetic layer 22 performs precession with the modified magnetization easy axis as the center. When approximately half-cycle precession has been performed, the application of the third voltage is stopped, and a fourth voltage having a smaller amplitude than the third voltage is applied across the terminal A and the terminal B, that is, across the first magnetic layer 21 and the second magnetic layer 22. Accordingly, the magnetization easy axis in the second magnetic layer 22 is returned to the original direction to terminate the precession, and the magnetization direction in the second magnetic layer 22 can be brought to a substantially reversed state to the original direction, that is, can be brought to a substantially parallel state to the magnetization direction of the first magnetic layer 21.

The application of the third voltage followed by the application of the fourth voltage is performed so that current flows from the second magnetic layer 22 towards the first magnetic layer 21 can render the magnetization direction of the reversed second magnetic layer 22 more nearly parallel to the magnetization direction of the first magnetic layer 21.

Thus, in the control method for a magnetoresistance effect element and the control device for a magnetoresistance effect element in an embodiment of the second invention, as illustrated in FIG. 10, the application of a third voltage for a duration time $t_E$ followed by the application of a fourth voltage for a duration time $t_1$ allows the magnetization direction of the second magnetic layer 22 to be rewritten from a nearly antiparallel state to a nearly parallel state to the magnetization direction of the first magnetic layer 21.

Thus, in the control method for a magnetoresistance effect element and the control device for a magnetoresistance effect element in an embodiment of the second invention, at the outset, the first voltage or the third voltage is applied across the second ferromagnetic layer and the metallic layer 24 to reverse the magnetization direction of the second magnetic layer 22 through the utilization of the electric field induced magnetization reversal method, followed by the application of the second voltage or the fourth voltage across the first magnetic layer 21 and the second magnetic layer 22 to enhance the probability of success in magnetization reversal through the utilization of the spin injection magnetization reversal method, whereby magnetization reversal can be stably performed. Accordingly, as compared with the case where only the spin injection magnetization reversal method is utilized, the writing speed is higher and the power consumption is lower. Further, the regulation in the electric field induced magnetization reversal method can be easily carried out, and, on the whole, highly controllable and stable magnetization reversal operation can be performed.

When the magnetoresistance effect element 20 is brought to sufficiently high resistance by regulating the resistance of the insulating layer 25, the function as the magnetoresistance effect element can be maintained while significantly reducing the power consumption in the electric field induced magnetization reversal method, and the effect of reducing the power consumption is greater than that in the magnetoresistance effect element 10. In the control device for a magnetoresistance effect element in an embodiment of the second invention, the magnetoresistance effect element 20 is regulated by a control unit.

LIST OF REFERENCE SIGNS 10, 10a Magnetoresistance effect element
11 First magnetic layer
12 Second magnetic layer
13 Insulating layer
20 Magnetoresistance effect element
21 First magnetic layer
22 Second magnetic layer
23 Non-magnetic layer
24 Metallic layer
25 Insulating layer

What is claimed is:

1. A control method for a magnetoresistance effect element, the magnetoresistance effect element including a first magnetic layer connected to a first terminal; a second magnetic layer with a magnetization direction easier to be modified than that of the first magnetic layer, the second magnetic layer being connected to a second terminal; and an insulating layer disposed between the first magnetic layer and the second magnetic layer, the method comprising:

when the magnetization direction of the second magnetic layer is parallel to the magnetization direction of the first magnetic layer,
applying a first voltage between the first magnetic layer and the second magnetic layer via the first and second terminals for a predetermined period to reverse the magnetization direction of the second magnetic layer by modifying a direction of a magnetization easy axis of the second magnetic layer, the predetermined period being in a range of 0.1 to 0.3 cycle of precession of a magnetic moment in the second magnetic layer, and
after said applying a first voltage, applying a second voltage having a smaller amplitude than that of the first voltage, between the first magnetic layer and the second magnetic layer via the first and second terminals so that current flows from the first magnetic layer toward the second magnetic layer, and when the magnetization direction of the second magnetic layer is antiparallel to the magnetization direction of the first magnetic layer,
applying a third voltage between the first magnetic layer and the second magnetic layer via the first and second terminals for the predetermined period to reverse the magnetization direction of the second magnetic layer by modifying the direction of the magnetization easy axis of the second magnetic layer, and
after said applying a third voltage, applying a fourth voltage having a smaller amplitude than that of the third voltage, between the first magnetic layer and the second magnetic layer via the first and second terminals so that current flows from the second magnetic layer toward the first magnetic layer.

2. The control method for a magnetoresistance effect element according to claim 1, wherein, in the step of reversing the magnetization direction of the second magnetic layer, the direction of the magnetization easy axis in the second magnetic layer is modified by applying the first or third voltage across the first magnetic layer and the second magnetic layer and, when the magnetization of the second magnetic layer that performs precession with the modified magnetization easy axis as a center is reversed, the first voltage or the third voltage is switched to the second voltage or the fourth voltage.

3. The control method for a magnetoresistance effect element according to claim 1, wherein a voltage having a predetermined magnitude or larger is applied as the first voltage and the third voltage for the predetermined period to rotate the magnetization direction of the second magnetic layer by an angle of more than 90 degrees and less than 270 degrees from an original direction.

4. A control method for a magnetoresistance effect element including a first magnetic layer connected to a first terminal; a second magnetic layer with a magnetization direction easier to be modified than that of the first magnetic layer, the second magnetic layer being connected to a second terminal; a non-magnetic layer disposed between the first magnetic layer and the second magnetic layer; a metallic layer disposed on a side opposite to the second magnetic layer relative to the first magnetic layer, the metallic layer being connected to a third terminal; and an insulating layer between the second magnetic layer and the metallic layer, the method comprising:

when the magnetization direction of the second magnetic layer is parallel to the magnetization direction of the first magnetic layer,
applying a first voltage between the second magnetic layer and the metallic layer via the first and second terminals to reverse the magnetization direction of the second magnetic layer by modifying a direction of a magnetization easy axis of the second magnetic layer, and
after said applying a first voltage, applying a second voltage having a smaller amplitude than that of the first voltage, between the first magnetic layer and the second magnetic layer via the first and second terminals so that current flows from the first magnetic layer toward the second magnetic layer, and when the magnetization direction of the second magnetic layer is antiparallel to the magnetization direction of the first magnetic layer,
applying a third voltage between the second magnetic layer and the metallic layer via the first and second terminals to reverse the magnetization direction of the second magnetic layer by modifying the direction of the magnetization easy axis of the second magnetic layer, and
after said applying a third voltage, applying a fourth voltage having a smaller amplitude than that of the third voltage, between the first magnetic layer and the second magnetic layer via the first and second terminals so that current flows from the second magnetic layer toward the first magnetic layer.

5. The control method for a magnetoresistance effect element according to claim 4, wherein, in the step of reversing the magnetization direction of the second magnetic layer, the direction of the magnetization easy axis in the second magnetic layer is modified by applying the first or third voltage across the second magnetic layer and the metallic layer and, when the magnetization of the second magnetic layer that performs precession with the modified magnetization easy axis as the center is reversed, the first voltage or the third voltage is switched to the second voltage or the fourth voltage.

6. The control method for a magnetoresistance effect element according to claim 4, wherein a voltage having a predetermined magnitude or larger is applied as the first voltage and the third voltage for a predetermined period-of time to rotate the magnetization direction of the second magnetic layer by an angle of more than 90 degrees and less than 270 degrees from an original direction.

7. A control device for a magnetoresistance effect element, the magnetoresistance effect element comprising a first magnetic layer connected to a first terminal, a second magnetic layer with a magnetization direction easier to be modified than that of the first magnetic layer, the second magnetic layer being connected to a second terminal, and an insulating layer disposed between the first magnetic layer and the second magnetic layer, the control device comprising:

a control unit configured to,
when the magnetization direction of the second magnetic layer is parallel to the magnetization direction of the first magnetic layer,
apply a first voltage between the first magnetic layer and the second magnetic layer via the first and second terminals for a predetermined period so that the magnetization direction of the second magnetic layer is reversed by modifying the direction of a magnetization easy axis of the second magnetic layer, the predetermined period being in a range of 0.1 to 0.3 cycle of precession of a magnetic moment in the second magnetic layer, and
after said applying a first voltage, applying a second voltage having a smaller amplitude than that of the first voltage, between the first magnetic layer and the second magnetic layer via the first and second terminals so that current flows from the first magnetic layer toward the second magnetic layer, and when the magnetization direction of the second magnetic layer is antiparallel to the magnetization direction of the first magnetic layer,
apply a third voltage between the first magnetic layer and the second magnetic layer via the first and second terminals for the predetermined period so that the magnetization direction of the second magnetic layer is reversed by modifying the direction of the magnetization easy axis of the second magnetic layer, and
after said applying a third voltage, applying a fourth voltage having a smaller amplitude than that of the third voltage, between the first magnetic layer and the second magnetic layer via the first and second terminals so that current flows from the second magnetic layer toward the first magnetic layer.

8. The control device for a magnetoresistance effect element according to claim 7, wherein the control unit is configured so that, in the step of reversing the magnetization direction of the second magnetic layer, the direction of the magnetization easy axis in the second magnetic layer is modified by applying the first or third voltage across the first magnetic layer and the second magnetic layer and, when the magnetization of the second magnetic layer that performs precession with the modified magnetization easy axis as the center is reversed, the first voltage or the third voltage is switched to the second voltage or the fourth voltage.

9. The control device for a magnetoresistance effect element according to claim 7, wherein the control unit is configured so that a voltage having a predetermined magnitude or larger is applied as the first voltage and the third voltage for the predetermined period to rotate the magnetization direction of the second magnetic layer by an angle of more than 90 degrees and less than 270 degrees from an original direction.

10. A control device for a magnetoresistance effect element, the magnetoresistance effect element including a first magnetic layer connected to a first terminal, a second magnetic layer with a magnetization direction easier to be modified than that of the first magnetic layer, the second magnetic layer being connected to a second terminal, a non-magnetic layer disposed between the first magnetic layer and the second magnetic layer, a metallic layer disposed on a side opposite to the second magnetic layer relative to the first magnetic layer, the metallic layer being connected to a third terminal, and an insulating layer between the second magnetic layer and the metallic layer, the control device comprising:

a control unit configured to,
when the magnetization direction of the second magnetic layer is parallel to the magnetization direction of the first magnetic layer, apply a first voltage between the second magnetic layer and the metallic layer via the first and second terminals to reverse the magnetization direction of the second magnetic layer by modifying the direction of a magnetization easy axis of the second magnetic layer, and after said applying a first voltage, applying of a second voltage having a smaller amplitude than that of the first voltage across the first magnetic layer and the second magnetic layer via the first and second terminals so that current flows from the first magnetic layer toward the second magnetic layer, and when the magnetization direction of the second magnetic layer is antiparallel to the magnetization direction of the first magnetic layer, apply a third voltage between the second magnetic layer and the metallic layer via the first and second terminals to reverse the magnetization direction of the second magnetic layer by modifying the direction of the magnetization easy axis of the second magnetic layer, and after said applying a third voltage, applying of a fourth voltage having a smaller amplitude than that of the third voltage across the first magnetic layer and the second magnetic layer via the first and second terminals so that current flows from the second magnetic layer toward the first magnetic layer.

11. The control device for a magnetoresistance effect element according to claim 10, wherein the control unit is configured so that, in the step of reversing the magnetization direction of the second magnetic layer, the direction of the magnetization easy axis in the second magnetic layer is modified by applying the first or third voltage across the second magnetic layer and the metallic layer and, when the magnetization of the second magnetic layer that performs precession with the modified magnetization easy axis as the center is reversed, the first voltage or the third voltage is switched to the second voltage or the fourth voltage.

12. The control device for a magnetoresistance effect element according to claim 10, wherein the control unit is configured so that a voltage having a predetermined magnitude or larger is applied as the first voltage and the third voltage for a predetermined period-of time to rotate the magnetization direction of the second magnetic layer by an angle of more than 90 degrees and less than 270 degrees from an original direction.

13. A control method for a magnetoresistance effect element, the magnetoresistance effect element including a first magnetic layer connected to a first terminal; and a second magnetic layer with a magnetization direction easier to be modified than that of the first magnetic layer, the second magnetic layer being connected to a second terminal, the method comprising reversing the magnetization direction of the second magnetic layer, wherein the reversing the magnetization direction includes:
applying a first voltage between the first magnetic layer and the second magnetic layer via the first and second terminals for a predetermined period, the predetermined period being in a range of 0.1 to 0.3 cycle of precession of a magnetic moment in the second magnetic layer, and applying, after the first voltage is applied, a second voltage between the first magnetic layer and the second magnetic layer via the first and second terminals so that a current flows from the first magnetic layer to the second magnetic layer or from the second magnetic layer to the first magnetic layer, the first voltage being greater than the second voltage.

14. A control device for a magnetoresistance effect element, the magnetoresistance effect element including a first magnetic layer connected to a first terminal and a second magnetic layer with the magnetization direction easier to be modified than that of the first magnetic layer, the second magnetic layer being connected to a second terminal, the control device comprising:
a control unit configured to reverse the magnetization direction of the second magnetic layer
by applying a first voltage between the first magnetic layer and the second magnetic layer via the first and second terminals for a predetermined period, the predetermined period being in a range of 0.1 to 0.3 cycle of precession of a magnetic moment in the second magnetic layer, and
by applying, after the first voltage is applied, a second voltage between the first magnetic layer and the second magnetic layer via the first and second terminals so that a current flows from the first magnetic layer to the second magnetic layer or from the second magnetic layer to the first magnetic layer, the first voltage being greater than the second voltage.

15. The control device for a magnetoresistance effect element according to claim 14, wherein the control unit is configured to
write data to the magnetoresistance effect element by reversing the magnetization direction of the second magnetic layer; and
read the data from the magnetoresistance effect element by sensing a resistance of the magnetoresistance effect element.

16. A control device for a magnetoresistance effect element, the magnetoresistance effect element including a first magnetic layer connected to a first terminal and a second magnetic layer having a magnetization direction that is more easily modified than a magnetization direction of the first magnetic layer, the second magnetic layer being connected to a second terminal, the control device comprising:
a controller configured to
write data to the magnetoresistance effect element in a writing mode by controlling the magnetization direction of the second magnetic layer, the controlling the magnetization direction of the second magnetic layer including
applying a first voltage between the first magnetic layer and the second magnetic layer via the first and second terminals for a predetermined period, the predetermined period being in a range of 0.1 to 0.3 cycle of precession of a magnetic moment in the second magnetic layer, and
applying, after the first voltage is applied, a second voltage between the first magnetic layer and the second magnetic layer via the first and second terminals so that a current flows from the first magnetic layer to the second magnetic layer or from the second magnetic layer to the first magnetic layer, the first voltage being greater than the second voltage; and
read the data from the magnetoresistance effect element in a reading mode based on a resistance of the magnetoresistance effect element.

17. The control device for a magnetoresistance effect element, according to claim 16, wherein the controller substantially reverses the magnetization direction of the second magnetic layer by applying the first voltage in the writing mode, and stabilizes the magnetization direction of the second magnetic layer by applying the second voltage in the writing mode.

18. A control device for a magnetoresistance effect element, the magnetoresistance effect element including a first magnetic layer connected to a first terminal; a second magnetic layer with a magnetization direction easier to be modified than that of the first magnetic layer, the second magnetic layer being connected to a second terminal; and an insulating layer disposed between the first magnetic layer and the second magnetic layer, the control device comprising:

a control unit configured to,
when the magnetization direction of the second magnetic layer is parallel to the magnetization direction of the first magnetic layer,
applying a first voltage between the first magnetic layer and the second magnetic layer via the first and second terminals for a first predetermined period so that the magnetization direction of the second magnetic layer is reversed by modifying a direction of a magnetization easy axis of the second magnetic layer, and
after said applying a first voltage, applying a second voltage having a smaller amplitude than that of the first voltage, between the first magnetic layer and the second magnetic layer via the first and second terminals for a second predetermined period so that current flows from the first magnetic layer toward the second magnetic layer, and
when the magnetization direction of the second magnetic layer is antiparallel to the magnetization direction of the first magnetic layer,
applying a third voltage between the first magnetic layer and the second magnetic layer via the first and second terminals for the first predetermined period so that the magnetization direction of the second magnetic layer is reversed by modifying the direction of the magnetization easy axis of the second magnetic layer, and
after said applying a third voltage, applying a fourth voltage having a smaller amplitude than that of the third voltage, between the first magnetic layer and the second magnetic layer via the first and second terminals for the second predetermined period so that current flows from the second magnetic layer toward the first magnetic layer, the first predetermined period being in a range of 0.1 to 0.5 cycle of precession of a magnetic moment in the second magnetic layer, wherein
when the first predetermined period is in the range 0.1 to 0.2 cycle of precession of a magnetic moment in the first magnetic layer, the second predetermined period is equal to or greater than 6.75 ns,
when the first predetermined period is in the range 0.2 to 0.3 cycle of precession of a magnetic moment in the first magnetic layer, the second predetermined period is equal to or greater than 3 ns,
when the first predetermined period is in the range 0.3 to 0.4 cycle of precession of a magnetic moment in the first magnetic layer, the second predetermined period is equal to or greater than 1 ns, and when the first predetermined period is in the range 0.4 to 0.5 cycle of precession of a magnetic moment in the first magnetic layer, the second predetermined period is equal to or greater than 0.25 ns.

19. A control device for a magnetoresistance effect element, the magnetoresistance effect element including a first magnetic layer connected to a first terminal; a second magnetic layer with a magnetization direction easier to be modified than that of the first magnetic layer, the second magnetic layer being connected to a second terminal; and an insulating layer disposed between the first magnetic layer and the second magnetic layer, the control device comprising:

a control unit configured to,
when the magnetization direction of the second magnetic layer is parallel to the magnetization direction of the first magnetic layer,
applying a first voltage between the first magnetic layer and the second magnetic layer via the first and second terminals for a predetermined period of time to reverse the magnetization direction of the second magnetic layer by modifying a direction of a magnetization easy axis of the second magnetic layer, the predetermined period of time being in a range of 0.25 ns to 0.75 ns of precession of a magnetic moment in the second magnetic layer, and
after said applying a first voltage, applying a second voltage having a smaller amplitude than that of the first voltage, between the first magnetic layer and the second magnetic layer via the first and second terminals so that current flows from the first magnetic layer toward the second magnetic layer, and
when the magnetization direction of the second magnetic layer is antiparallel to the magnetization direction of the first magnetic layer,
applying a third voltage between the first magnetic layer and the second magnetic layer via the first and second terminals for the predetermined period of time to reverse the magnetization direction of the second magnetic layer by modifying the direction of the magnetization easy axis of the second magnetic layer, and
after said applying a third voltage, applying a fourth voltage having a smaller amplitude than that of the third voltage, between the first magnetic layer and the second magnetic layer via the first and second terminals so that current flows from the second magnetic layer toward the first magnetic layer.

20. A control device for a magnetoresistance effect element, the magnetoresistance effect element including a first magnetic layer connected to a first terminal; a second magnetic layer with a magnetization direction easier to be modified than that of the first magnetic layer, the second magnetic layer being connected to a second terminal; and an insulating layer disposed between the first magnetic layer and the second magnetic layer, the control device comprising:

a control unit configured to,
when the magnetization direction of the second magnetic layer is parallel to the magnetization direction of the first magnetic layer,
applying a first voltage between the first magnetic layer and the second magnetic layer via the first and second terminals for a first predetermined period of time to reverse the magnetization direction of the second magnetic layer by modifying a direction of a magnetization easy axis of the second magnetic layer, and after said applying a first voltage, applying a second voltage having a smaller amplitude than that of the first voltage, between the first magnetic layer and the second magnetic layer via the first and second terminals for a second predetermined period of time so that current flows from the first magnetic layer toward the second magnetic layer, and when the magnetization direction of the second magnetic layer is antiparallel to the magnetization direction of the first magnetic layer, applying a third voltage between the first magnetic layer and the second magnetic layer via the first and second terminals for the first predetermined period of time to reverse the magnetization direction of the second magnetic layer by modifying a direction of a magnetization easy axis of the second magnetic layer, and after said applying a third voltage, applying a fourth voltage having a smaller amplitude than that of the first voltage, between the first magnetic layer and the second magnetic layer via the first and second terminals for the second predetermined period of time so that current flows from the first magnetic layer toward the second magnetic layer, the first predetermined period of time being in a range of 0.25 ns to 1.25 ns, wherein when the first predetermined period of time is in the range 0.25 ns to 0.5 ns, the second predetermined period is equal to or greater than 6.75 ns, when the first predetermined period of time is in the range 0.5 ns to 0.75 ns, the second predetermined period is equal to or greater than 3 ns, when the first predetermined period of time is in the range 0.75 ns to 1 ns, the second predetermined period of time is equal to or greater than 1 ns, and when the first predetermined period of time is in the range 1 ns to 1.25 ns, the second predetermined period of time is equal to or greater than 0.25 ns.

* * * * *